(12) United States Patent
Nagai et al.

(10) Patent No.: US 6,834,981 B2
(45) Date of Patent: Dec. 28, 2004

(54) LIGHT-EMITTING UNIT, LIGHT-EMITTING UNIT COMBINATION, AND LIGHTING APPARATUS ASSEMBLED FROM A PLURALITY OF LIGHT-EMITTING UNITS

(75) Inventors: Hideo Nagai, Takatsuki (JP); Nobuyuki Matsui, Takatsuki (JP); Tetsushi Tamura, Takatsuki (JP)

(73) Assignee: Matsushita Electric Industrial Co., Ltd., Osaka-Fu (JP)

( * ) Notice: Subject to any disclaimer, the term of this patent is extended or adjusted under 35 U.S.C. 154(b) by 0 days.

(21) Appl. No.: 10/245,521

(22) Filed: Sep. 17, 2002

(65) Prior Publication Data

US 2003/0067775 A1 Apr. 10, 2003

(30) Foreign Application Priority Data

Sep. 20, 2001 (JP) ........................................ 2001-287667

(51) Int. Cl.[7] .............................................. F21V 11/00

(52) U.S. Cl. ........................ 362/240; 362/35; 362/237; 362/244; 362/545; 362/231; 362/800; 257/88; 257/89; 257/91; 313/500

(58) Field of Search ................................ 362/231, 240, 362/545, 800, 244, 237; 257/88, 89, 91; 313/500; 361/760

(56) References Cited

U.S. PATENT DOCUMENTS

| | | | | |
|---|---|---|---|---|
| 5,491,349 A | * | 2/1996 | Komoto et al. | 257/88 |
| 5,874,748 A | * | 2/1999 | Osawa | 257/91 |
| 5,893,633 A | * | 4/1999 | Uchio et al. | 362/244 |
| 6,183,100 B1 | * | 2/2001 | Suckow et al. | 362/35 |
| 2001/0007360 A1 | * | 7/2001 | Yoshida et al. | 257/89 |
| 2002/0006040 A1 | * | 1/2002 | Kamada et al. | 362/237 |

FOREIGN PATENT DOCUMENTS

JP  2002-184207  6/2002

* cited by examiner

*Primary Examiner*—Stephen Husar
*Assistant Examiner*—James Cranson

(57) ABSTRACT

A number of red LEDs, green LEDs, and blue LEDs are mounted on one surface of a multilayer flexible substrate having a round plane figure. The LEDs are connected in series according to color. At least three sets of terminals which are each made up of a red feeder terminal, a green feeder terminal, a blue feeder terminal, and a common feeder terminal are provided on the periphery of the flexible substrate. Wiring patterns for connecting LEDs at the high-potential end of the red, green, and blue series-connected LEDs respectively to the red feeder terminals, the green feeder terminals, and the blue feeder terminals are provided to the flexible substrate. Also, a wiring pattern for connecting LEDs at the low-potential end of the red, green, and blue series-connected LEDs all to the common feeder terminals is provided to the flexible substrate.

24 Claims, 17 Drawing Sheets

FIG.11A
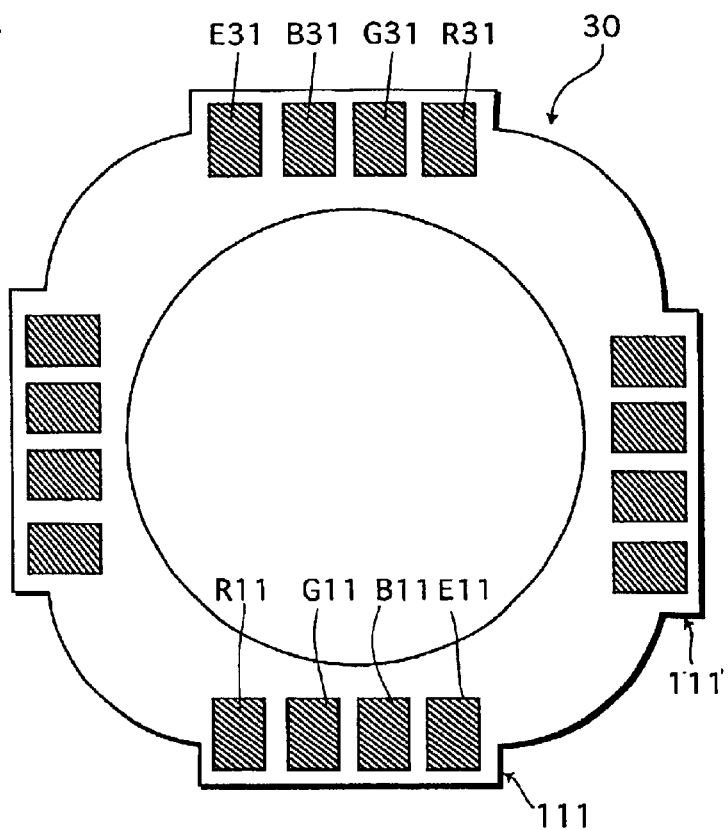
FIG.11B
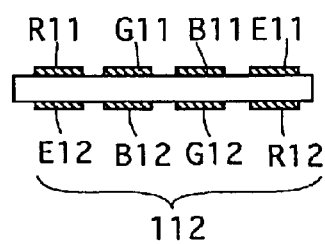
FIG.11C
FIG.11D
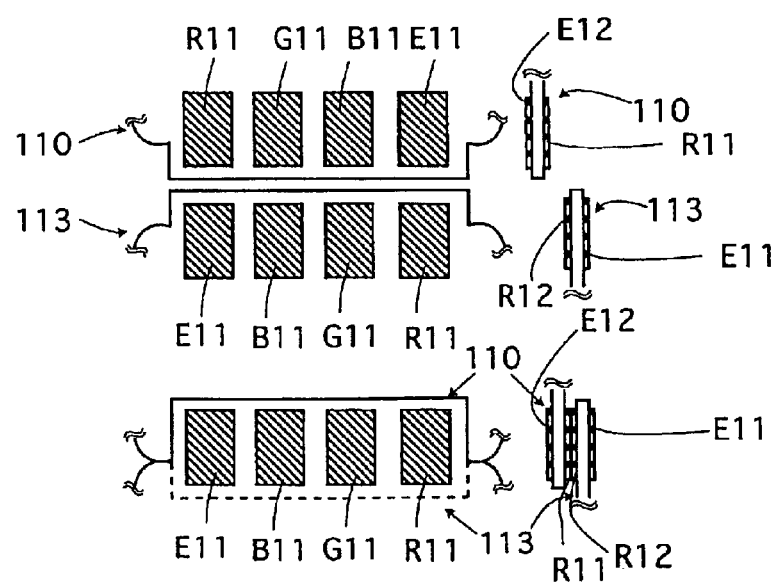

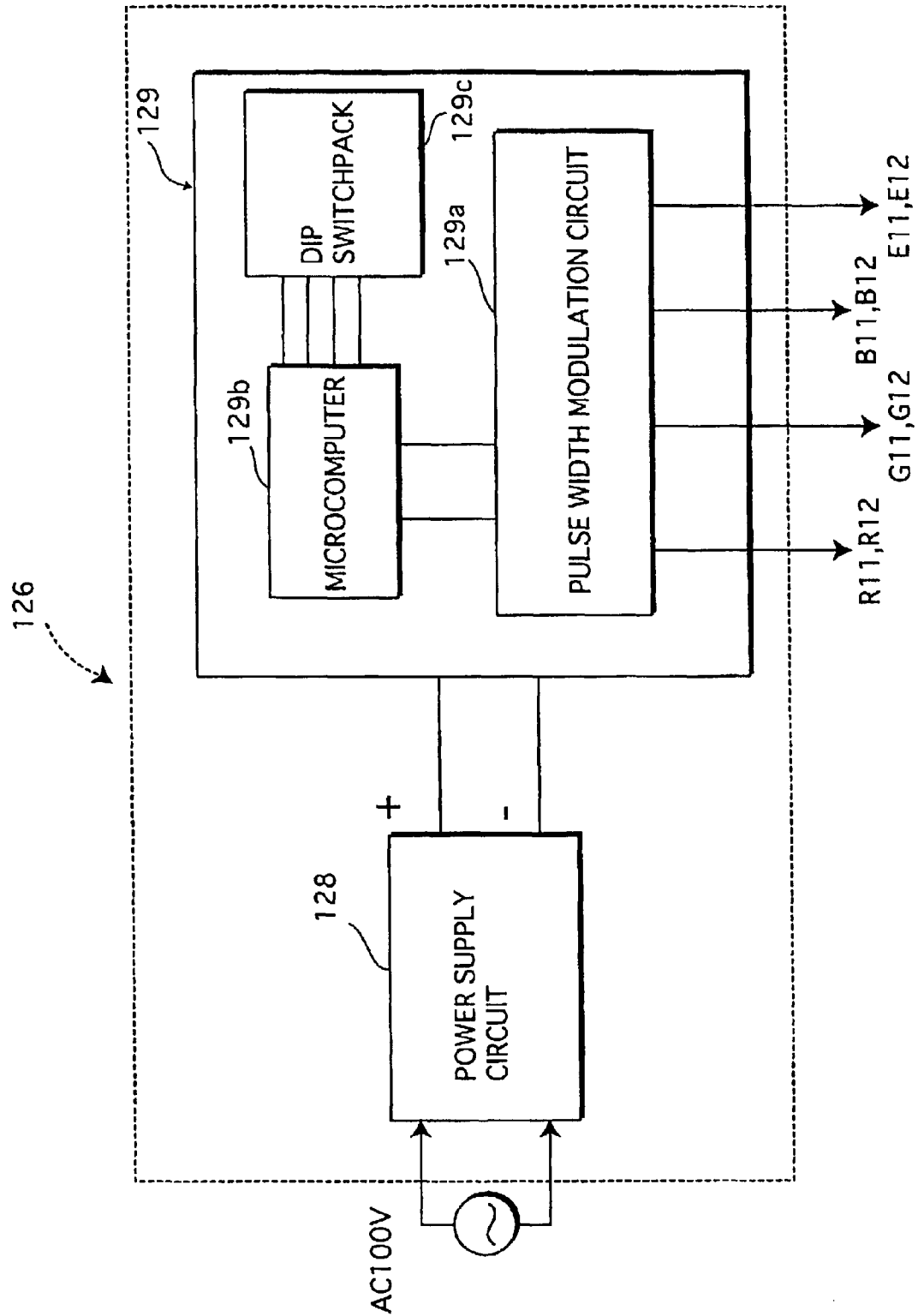

LIGHT-EMITTING UNIT, LIGHT-EMITTING UNIT COMBINATION, AND LIGHTING APPARATUS ASSEMBLED FROM A PLURALITY OF LIGHT-EMITTING UNITS This application is based on an application No. 2001-287667 filed in Japan, the contents of which are hereby incorporated by reference.

BACKGROUND OF THE INVENTION

1. Field of the Invention

The present invention relates to a light-emitting unit, a light-emitting unit combination, and a lighting apparatus assembled from a plurality of light-emitting units.

2. Related Art

With diversification of fashions and consumer tastes, designs of various products, both movables and immovables, are increasingly diversified in recent years. Lighting apparatuses are no exception. Attractive and functional designs which are free from conventional shapes are being proposed.

One example is a lighting apparatus that is assembled by connecting a plurality of flat light-emitting units. Such a lighting apparatus comes in several different shapes depending on how the plurality of light-emitting units are combined.

However, the number of shapes realized by this type of lighting apparatus is still limited, with there being only a low degree of design freedom.

SUMMARY OF THE INVENTION

The first object of the present invention is to provide a novel light-emitting unit that realizes an assembly in a wide variety of shapes of both flat (two-dimensional) and solid (three-dimensional) appearances.

The second object of the present invention is to provide a light-emitting unit combination that realizes an assembly in a wide variety of shapes of both flat and solid appearances.

The third object of the present invention is to provide a novel lighting apparatus that is assembled from a plurality of light-emitting units.

The first object can be achieved by a light-emitting unit including: a flat member which has a round shape; a light-emitting member which is provided on a main surface of the flat member; at least three sets of terminals which are provided on a periphery of the flat member so as to be apart from each other; and a wiring pattern which is provided to the flat member to connect each set of terminals with the light-emitting member.

Here, "providing at least three sets of terminals on the periphery of a flat round member" does not necessarily mean these sets of terminals are positioned at the very outer edges of the flat round member. They may instead be positioned a predetermined distance inside the outer edges of the flat round member.

The second object can be achieved by a light-emitting unit combination including: at least two light-emitting units, each light-emitting unit including: a flat member which has a round shape; a light-emitting member which is provided on a main surface of the flat member; at least three sets of terminals which are provided on a periphery of the flat member so as to be apart form each other; and a wiring pattern which is provided to the flat member to connect each set of terminals with the light-emitting member, wherein one set of terminals of a light-emitting unit is set facing one set of terminals of another light emitting unit, and corresponding terminals out of the facing sets of terminals are electrically connected.

The third object can be achieved by a lighting apparatus including: a plurality of light-emitting units; and a feeder unit which is connected to an external power supply, wherein each light-emitting unit includes: a flat member which has a round shape; a light-emitting member which is provided on a main surface of the flat member; at least three sets of terminals which are provided on a periphery of the flat member so as to be apart from each other; and a wiring pattern which is provided to the flat member to connect each set of terminals with the light-emitting member, the feeder unit includes: a flat substrate which has a round shape; and at least three sets of feeder terminals which are provided on a periphery of the flat substrate so as to be apart from each other, corresponding feeder terminals out of the at least three sets of feeder terminals being connected in parallel, the plurality of light-emitting units and the feeder unit are joined at predetermined areas so as to form a polyhedral figure, the predetermined areas each being an area where one set of terminals of a light-emitting unit is put facing one set of terminals of another light-emitting unit or one set of feeder terminals of the feeder unit, with corresponding terminals out of the facing sets of terminals of the light-emitting units being electrically connected to each other, and the plurality of light-emitting units are each electrically connected to the feeder unit in parallel.

The third object can also be achieved by a lighting apparatus that receives power from an external power supply circuit, including: a plurality of light-emitting units, each light-emitting unit including: a flat member which has a round shape; a light-emitting member which is provided on a main surface of the flat member; at least three sets of terminals which are provided on a periphery of the flat member so as to be apart from each other; and a wiring pattern which is provided to the flat member to connect each set of terminals with the light-emitting member, wherein the plurality of light-emitting units are joined at predetermined areas so as to form a polyhedral figure, the predetermined areas each being an area where one set of terminals of a light-emitting unit is put facing one set of terminals of another light-emitting unit, with corresponding terminals out of the facing sets of terminals being electrically connected to each other, and the plurality of light-emitting units are each electrically connected to the external power supply circuit in parallel.

BRIEF DESCRIPTION OF THE DRAWINGS

These and other objects, advantages and features of the invention will become apparent from the following description thereof taken in conjunction with the accompanying drawings which illustrate specific embodiments of the invention.

In the drawings:

FIG. 11A shows example feeder terminals;

FIG. 11B is a side view of the feeder terminals shown in FIG. 11A;

FIGS. 11C and 11D show a method of connecting the feeder terminals shown in FIGS. 11A and 11B;

FIG. 13 is a block diagram of a drive circuit in the base unit shown in FIG. 12B;

DESCRIPTION OF THE PREFERRED EMBODIMENTS

The following describes embodiments of the present invention with reference to drawings.

First Embodiment (Construction of a Light-Emitting Unit)

Figure 1A:
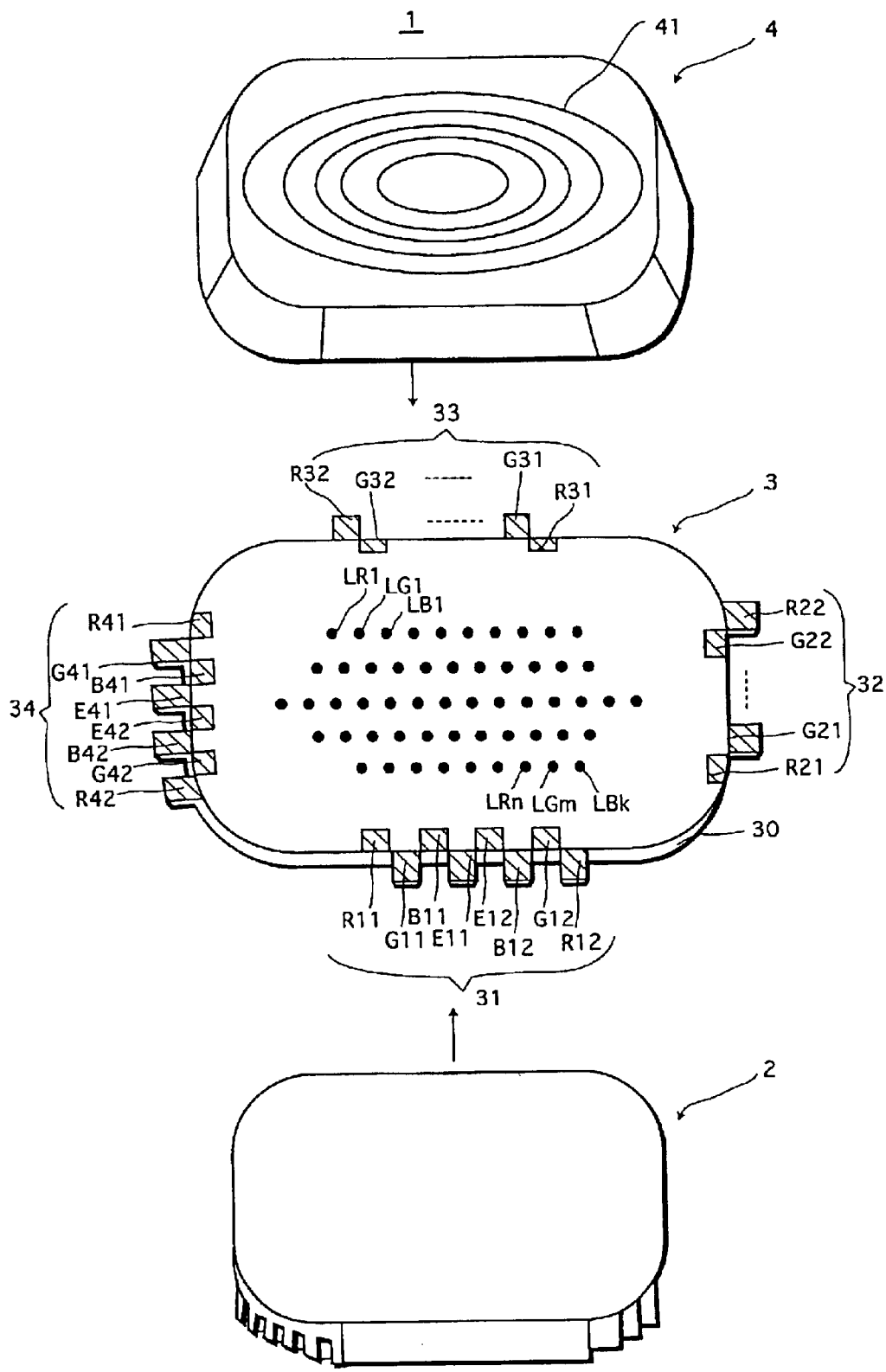
FIG. 1A is an exploded perspective view of a light-emitting unit which is the first embodiment of the invention.
Figure 2:
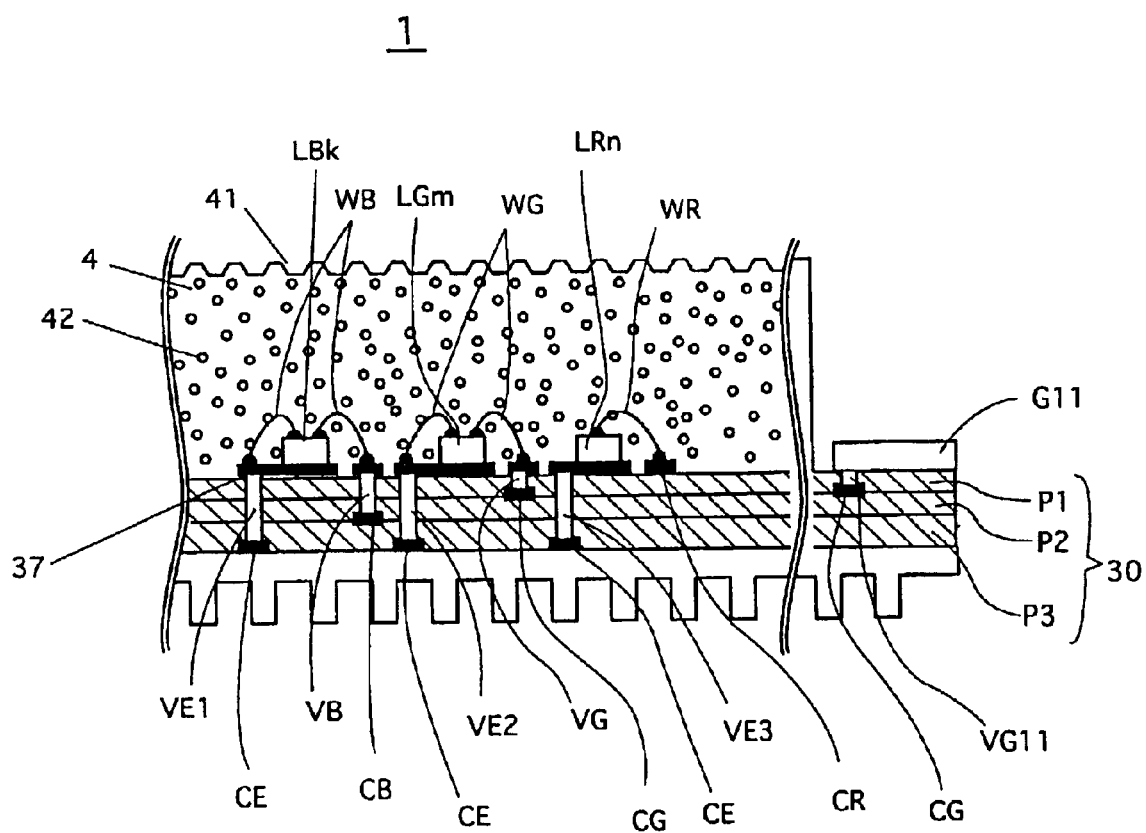
FIG. 2 is a sectional view of the light-emitting unit.

FIG. 1A is an exploded perspective view of a light-emitting unit 1. FIG. 2 is a sectional view of the light-emitting unit 1.

As shown in FIG. 1A, the light-emitting unit 1 is roughly made up of a radiating plate 2, a light-emitting substrate 3, and a resin layer 4.

Figure 1B:
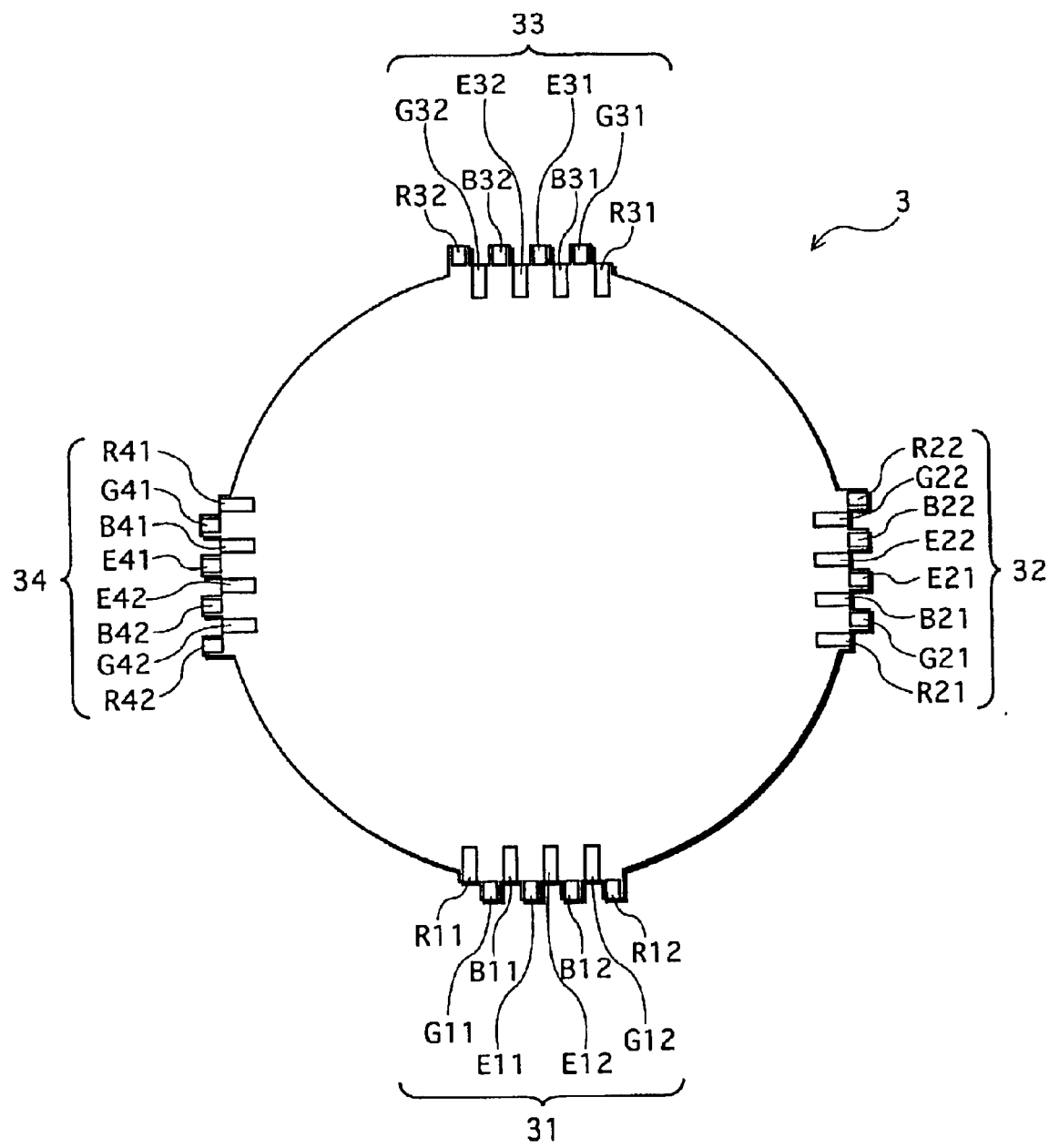
FIG. 1B shows a light-emitting substrate in the light-emitting unit shown in FIG. 1A.

It should be noted that actually the light-emitting substrate 3 is shaped like a circle except that the four parts where terminal sets 31–34 (described later) are provided slightly project outward, as shown in FIG. 1B. Since the following description mainly focuses on the terminal sets, the terminal sets are illustrated in close-up in the drawings such as FIG. 1A. Because of this, the light-emitting substrate 3 appears not circular in these drawings. Likewise, the radiating plate 2 and the resin layer 4 are actually circular like the light-emitting substrate 3, but appear not circular in the drawings such as FIG. 1A to conform to the deformation of the light-emitting substrate 3. Note also that light-emitting diode bear chips (described later) are omitted in FIG. 1B.

In FIG. 1A, the light-emitting substrate 3 includes a multilayer flexible substrate 30, red, green, and blue light-emitting diode bear chips (hereafter "LED chips") LR1–LRn, LG1–LGm, and LB1–LBk, and the four terminal sets 31–34. The flexible substrate 30 is made of a polyimide resin. The LED chips LR1–LRn, LG1–LGm, and LB1–LBk are deposited on the flexible substrate 30. The terminal sets 31–34 are provided on the periphery of the flexible substrate 30 at, for example, regular intervals.

Figure 3A:
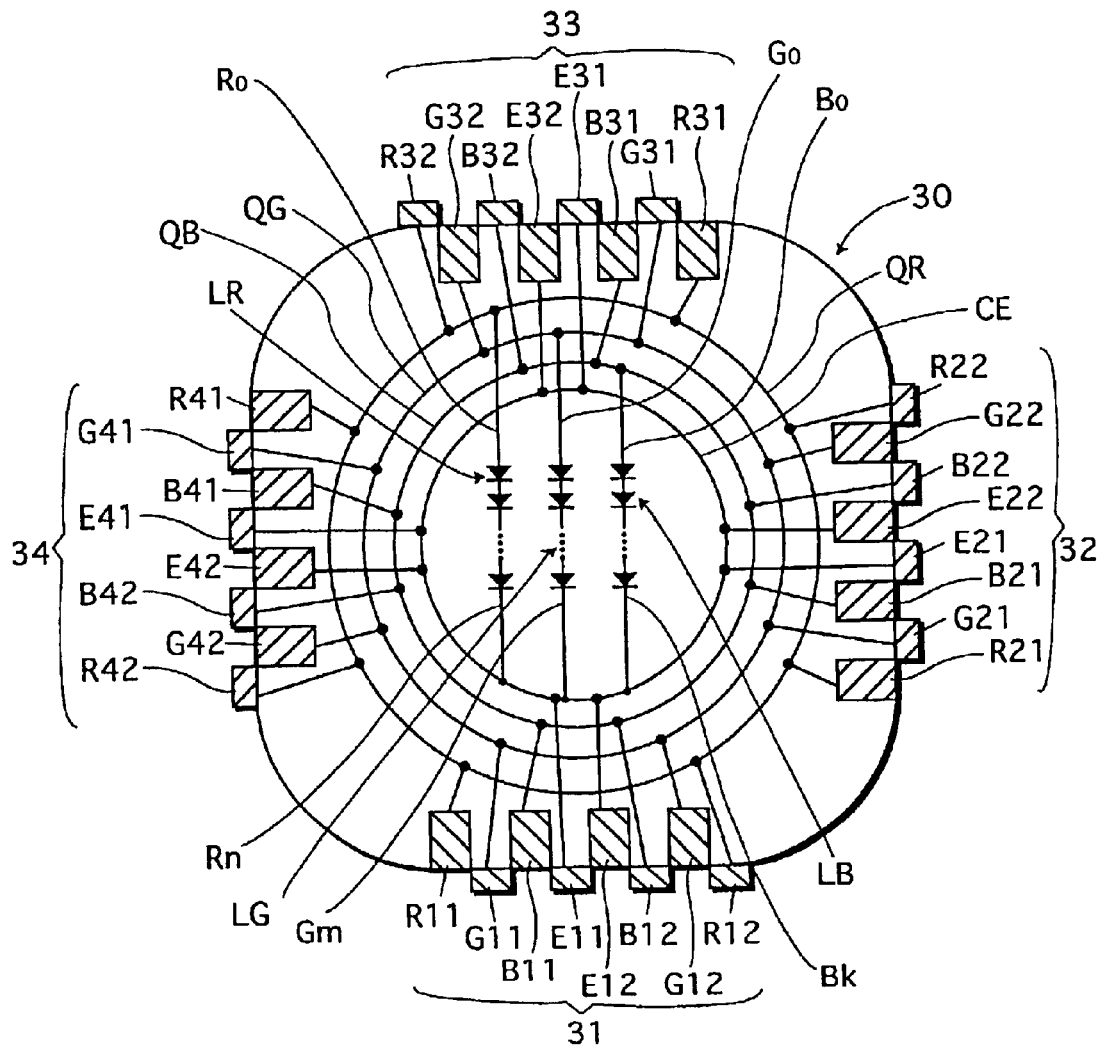
FIG. 3A shows a wiring pattern in the light-emitting unit.

The LED chips LR1–LRn, LG1–LGm, and LB1–LBk are connected in series according to color. In this specification, a group of LED chips that are connected in series is called an "LED chip train". Electrodes R0, G0, B0, Rn, Gm, and Bk are electrodes on the open sides of the respective LED chips LR1, LG1, LB1, LRn, LGm, and LBk which are situated at both ends of the LED chip trains LR, LG, and LB (see FIG. 3, such electrodes are hereafter called feeder electrodes). Each of these electrodes R0, G0, B0, Rn, Gm, and Bk is connected to the terminal sets 31–34, via a wiring pattern that is provided on a surface of a predetermined layer of the multilayer flexible substrate 30. Here, each of the terminal sets 31–34 is connected in series with the LED chip trains so that the LED chips of all of the red, green, and blue LED chip trains can be illuminated when power is supplied through any of the terminal sets 31–34, as shown in FIG. 3A. In this specification, components that relate to power supply to the red LED chips are designated with "R". Likewise, components that relate to power supply to the green LED chips are designated with "G". Components that relate to power supply to the blue LED chips are designated with "B". Components that relate to power supply to all of the red, green, and blue LED chips are designated with "E".

The LED chips LR1–LRn, LG1–LGm, and LB1–LBk are regularly arranged on the flexible substrate 30, in an order of alternating red, green, and blue as one example. The number of LED chips LR1–LRn, LG1–LGm, and LB1–LBk mounted on the flexible substrate 30 is determined according to factors such as the size of the light-emitting unit 1 and a required illumination intensity. However, they need at least be provided at such frequent intervals that enable a person to visually identify the emission of light when the LED chips are illuminated. On the other hand, the number of red LED chips LR1–LRn, the number of green LED chips LG1–LGm, and the number of blue LED chips LB1–LBk may be equal (n=m=k) or different (n≠m≠k).

Figure 5A:
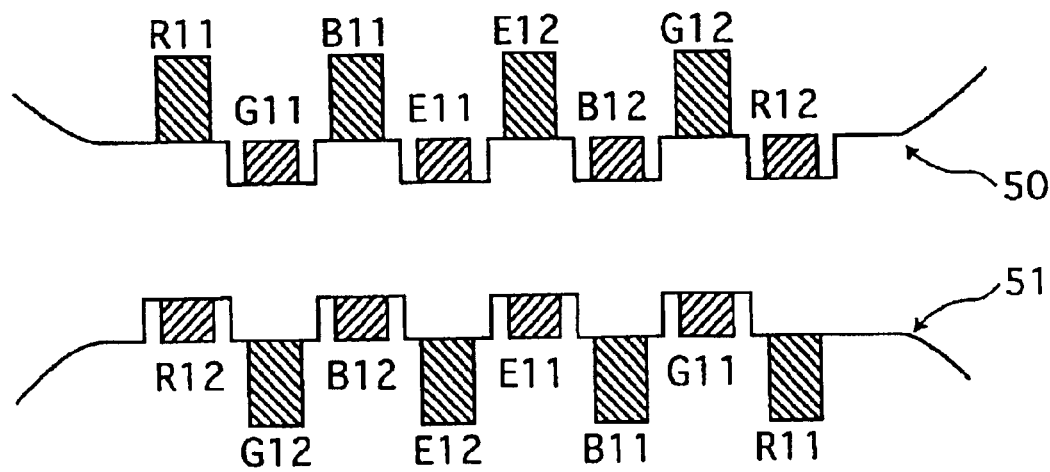
FIG. 5A shows example feeder terminals.

The terminal set 31 has eight feeder terminals R11, R12, G11, G12, B11, B12, E11, and E12. The pair of red feeder terminals R11 and R12 are connected to the red LED chip train LR. The pair of green feeder terminals G11 and G12 are connected to the green LED chip train LG. The pair of blue feeder terminals B11 and B12 are connected to the blue LED chip train LB. The pair of common feeder terminals E11 and E12 are connected to all of the red, green, and blue LED chip trains LR, LG, and LB. As shown in FIG. 5A, four projections are formed in part of the periphery of the flexible substrate 30 where the terminal set 31 is provided. When the projections are formed with a predetermined spacing in this way, the gaps between the adjacent projections can be regarded as depressions. This being so, the eight feeder terminals are provided at these alternating projections and depressions, in the order of R11, G11, B11, E11, E12, B12, G12, and R12 counterclockwise. In detail, the pair of common feeder terminals E11 and E12 are positioned in the middle, and the pair of red feeder terminals R11 and R12, the pair of green feeder terminals G11 and G12, and the pair of blue feeder terminals B11 and B12 are each positioned symmetrically with respect to the common feeder terminals E11 and E12. Which is to say, one feeder terminal out of each pair of red, green, blue, and common feeder terminals is situated at a projection, whereas the other feeder terminal is situated at a depression. This construction allows the terminal set 31 of the light-emitting unit 1 to be easily connected with the terminal set 31 of another light-emitting unit 1, as described later. The other terminal sets 32–34 have their feeder terminals arranged in the same way as the terminal set 31.

The resin layer 4 is formed from a translucent epoxy resin or the like. Part of the resin layer 4 forms a Fresnel lens 41. As shown in FIG. 2, an alumina powder 42 is mixed in the resin layer 4. The alumina powder 42 has a function of evenly scattering light emitted from the LED chips. This allows light of the different colors of red, green, and blue to be mixed with each other in the resin layer 4, as a result of which the mixed light is emitted from the Fresnel lens 41 to the outside with a directional orientation. In addition to this color mixing function, the alumina powder 42 serves to diffuse heat generated from the LED chips in a forward direction, thereby efficiently letting the heat escape from the resin layer 4 to the outside.

The radiating plate 2 has a structure, such as a fin, for dissipating heat generated from the light-emitting substrate 3 to the outside. The fin is a surface having projections and depressions, and provides an excellent cooling effect. The radiating plate 2 is bonded to the back of the light-emitting substrate 3 using a thermosetting adhesive or similar.

FIG. 2 shows a construction in which the LED chips LR1–LRn, LG1–LGm, and LB1–LBk and the feeder terminals R11, ..., G11, ..., B11, ..., and E11, ... are connected to wiring patterns. For convenience of explanation, only one LED chip of each color and only one feeder terminal are shown in the drawing.

As illustrated, the flexible substrate 30 is made by laminating three substrates P1–P3. A conductor pattern is formed on each of the substrates P1–P3 and at the bottom of the undermost substrate P3.

An electrode layer 37 is provided on the substrate P1, in an area where the LED chips LR1–LRn, LG1–LGm, and LB1–LBk are provided. Also, a wiring pattern CR for connecting the red LED chips LR1–LRn in series is formed on the substrate P1. A wiring pattern CG for connecting the green LED chips LG1–LGm in series is formed on the substrate P2. A wiring pattern CB for connecting the blue LED chips LB1–LBk in series is formed on the substrate P3. A wiring pattern CE for connecting to the low potential end of each of the red, green, and blue LED chip trains LR, LG, and LB is formed at the bottom of the substrate P3.

FIG. 2 shows the LED chips LRn, LGm, and LBk which are at the low potential end of the red, green, and blue LED chip trains respectively. One electrode on the low potential side of the LED chip LRn is connected to the wiring pattern CE through the electrode layer 37 and a via VE3, whereas the other electrode is connected to the wiring pattern CR through a bonding wire WR. One electrode on the low potential side of the LED chip LGm is connected to the wiring pattern CE through the electrode layer 37 and a via VE2, whereas the other electrode is connected to the wiring pattern CG through a bonding wire WG and a via VG. One electrode on the low potential side of the LED chip LBk is connected to the wiring pattern CE through the electrode layer 37 and a via VE1, whereas the other electrode is connected to the wiring pattern CB through a bonding wire WB and a via VB.

The feeder terminals R11, ..., G11, ..., and B11, ... formed on the periphery of the flexible substrate 30 are connected respectively to the red, green, and blue LED chip trains at the high potential end. Meanwhile, the feeder terminals E11, ... on the periphery of the flexible substrate 30 are connected to all of the LED chip trains at the low potential end.

The flexible substrate 30 having such wiring patterns and vias can be fabricated using a buildup method. In the buildup method, a wiring pattern is formed by applying copper foil to a polyimide layer and then conducting etching or the like. Also, a via is formed by making a hole (via) in the polyimide layer using a laser or the like and filling it with a copper paste. Such processed layers are laminated to form the multilayer flexible substrate 30.

FIG. 3 is a representation of wiring patterns QR, QG, QB, and CE provided to the substrates P1–P3. Connections between the LED chips LR1–LRn, LG1–LGm, and LB1–LBk and the feeder terminals R11, ..., G11, ..., B11, ..., and E11, ... are explained with reference to this drawing. Note that components which are the same as those shown in FIGS. 1A, 1B, and 2 have been given the same reference numerals. The same applies to the subsequent drawings.

As can be understood from FIG. 3A, the LED chips LR1–LRn, LG1–LGm, and LB1–LBk are connected in series according to color. The feeder electrodes Rn, Gm, and Bk at the low potential end of the respective LED chip trains LR, LG, and LB are connected to the wiring pattern CE. The wiring pattern CE is formed in the shape of a ring at the bottom of the substrate P3 shown in FIG. 2. Also, the wiring patterns QR, QG, and QB are formed in the shape of a ring on the substrates P1, P2, and P3 respectively. The feeder electrodes R0, G0, and B0 at the high potential end of the LED chip trains LR, LG, and LB are connected to the wiring patterns QR, QG, and QB, respectively.

Here, it is preferable to insert a current limiter diode in series in each of the LED chip trains LR, LG, and LB, in order to prevent the LED chips LR1–LRn, LG1–LGm, and LB1–LBk from being damaged due to a flow of a large amount of current.

In the terminal set 31, the feeder terminals R11 and R12 are connected to the high potential end of the red LED chip train LR via the wiring pattern QR. The feeder terminals G11 and G12 are connected to the high potential end of the green LED chip train LG via the wiring pattern QG. The feeder terminals B11 and B12 are connected to the high potential end of the blue LED chip train LB via the wiring pattern QB. The feeder terminals E11 and E12 are connected to the low potential end of each of the LED chip trains LR, LG, and LB via the wiring pattern CE. In the same manner, the feeder terminals R21, ..., G21, ..., B21, ..., and E21, ... in the terminal sets 32–34 are each connected to the high potential end of the corresponding LED chip train or the low potential end of each LED chip train.

Figure 3B:
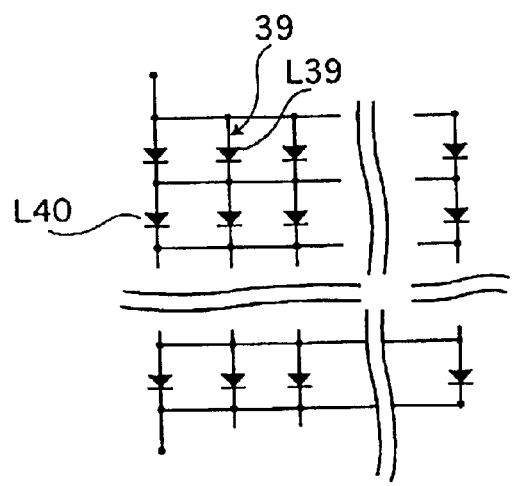
FIG. 3B shows another wiring pattern in the light-emitting unit.

Though the LED chips LR1–LRn, LG1–LGm, and LB1–LBk are connected in series according to color in the above example, they may be connected in series-parallel as shown in FIG. 3B. In doing so, even when a series-connected wire 39 is broken, only an LED chip L39 corresponding to the broken wire 39 fails to illuminate and the other LED chips are unaffected. Also, even when an LED chip L40 is damaged, the LED chip L40 alone fails to illuminate and the other LED chips are unaffected. Hence the problem of failing to emit light in any of the three colors of red, green, and blue can be avoided.

Figure 4A:
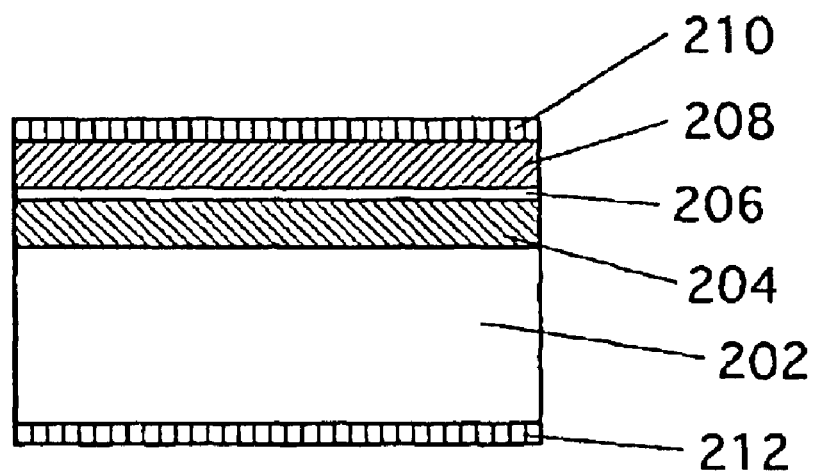
FIG. 4A shows a structure of a red LED in the light-emitting unit.
Figure 4B:
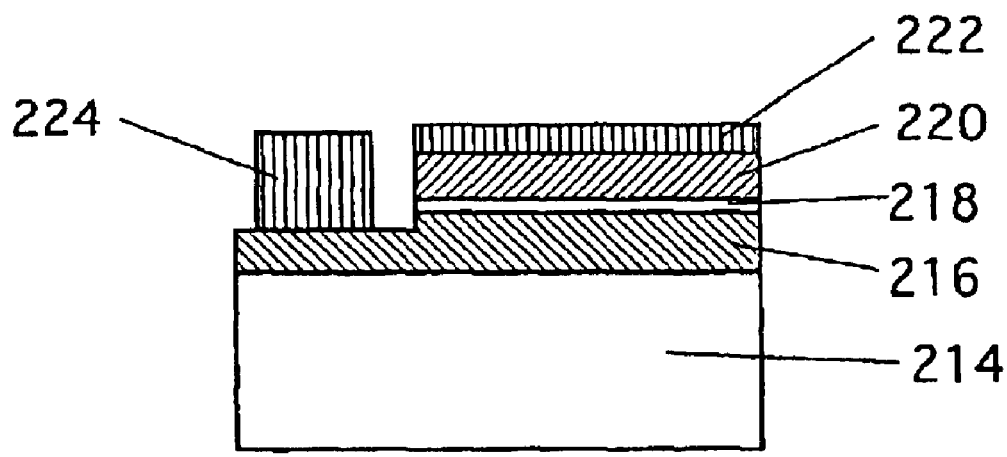
FIG. 4B shows a structure of a green LED and blue LED in the light-emitting unit.

FIGS. 4A and 4B show structures of the LED chips LR1–LRn, LG1–LGm, and LB1–LBk used in this embodiment.

Each of the red LED chips LR1–LRn is formed using an AlInGaP compound semiconductor. As shown in FIG. 4A, an N-type AlInGaP layer 204, an active layer 206, and a P-type AlInGaP layer 208 are laminated on a conductive N-type GaAs substrate 202. A high-potential anode electrode 210 is provided on the P-type layer 208, whilst a low-potential cathode electrode 212 is provided beneath the substrate 202.

Each of the green LED chips LG1–LGm and blue LED chips LB1–LBk is formed using an AlInGaN compound semiconductor. As shown in FIG. 4B, an N-type AlInGaN layer 216, an active layer 218, and a P-type AlInGaN layer 220 are laminated on an insulating sapphire substrate 214. A high-potential anode electrode 222 is provided on the P-type layer 220, whilst a low-potential cathode electrode 224 is provided on the N-type layer 216.

(Connection between Light-Emitting Units)

The light-emitting unit 1 having the above construction is connected with another light-emitting unit 1, to produce a flat or solid figure. Such a connection can be done by connecting terminal sets provided on the light-emitting substrates 3 of the light-emitting units 1. A method of connecting terminal sets is explained below, by referring to FIG. 5.

Figure 5B:
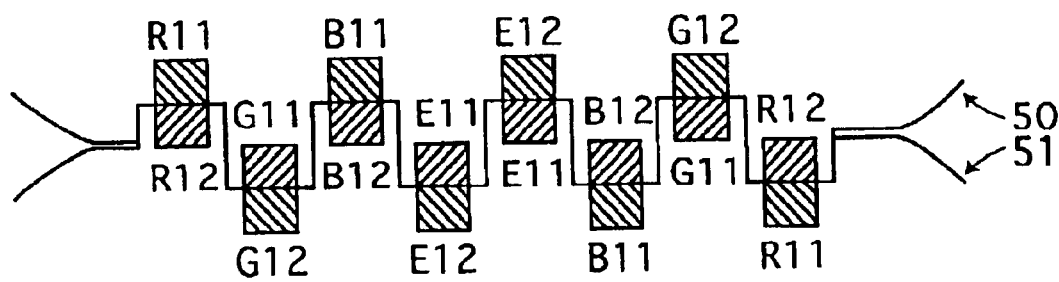
FIG. 5B shows the state where the feeder terminals shown in FIG. 5A are combined.

As shown in FIG. 5A, two light-emitting substrates 50 and 51 each have alternating projections and depressions. The terminal set 31 made up of the eight feeder terminals R11, G11, B11, E11, E12, B12, G12, and R12 is formed at these projections and depressions in this order. This being so, when the projections of the light-emitting substrate 50 and the depressions of the light-emitting substrate 51 are fitted together, the red feeder terminals R11 and R12, the green feeder terminals G11 and G12, the blue feeder terminals B11 and B12, and the common feeder terminals E11 and E12 overlap one another as shown in FIG. 5B. These feeder terminals are connected by soldering or the like. As a result, the LED chip trains LR, LG, and LB of the light-emitting substrate 50 are connected in parallel with the respective LED chip trains LR, LG, and LB of the light-emitting substrate 51. This being so, if power is supplied through a feeder terminal of any of the light-emitting substrates 50 and 51 which does not relate to the connection of the two light-emitting substrates, the LED chips of both light-emitting substrates 50 and 51 are illuminated. This can be done using a feeding voltage which is no greater than a voltage required to illuminate LED chips of one light-emitting unit.

(Modifications to the Construction of the Terminal Sets and the Connection between the Light-Emitting Units)

The construction of the terminal sets 31–34 provided on the flexible substrate 30 and the connection structure and connection means between the light-emitting units 1 are not limited to the above. Example modifications are given below.

Figure 6A:
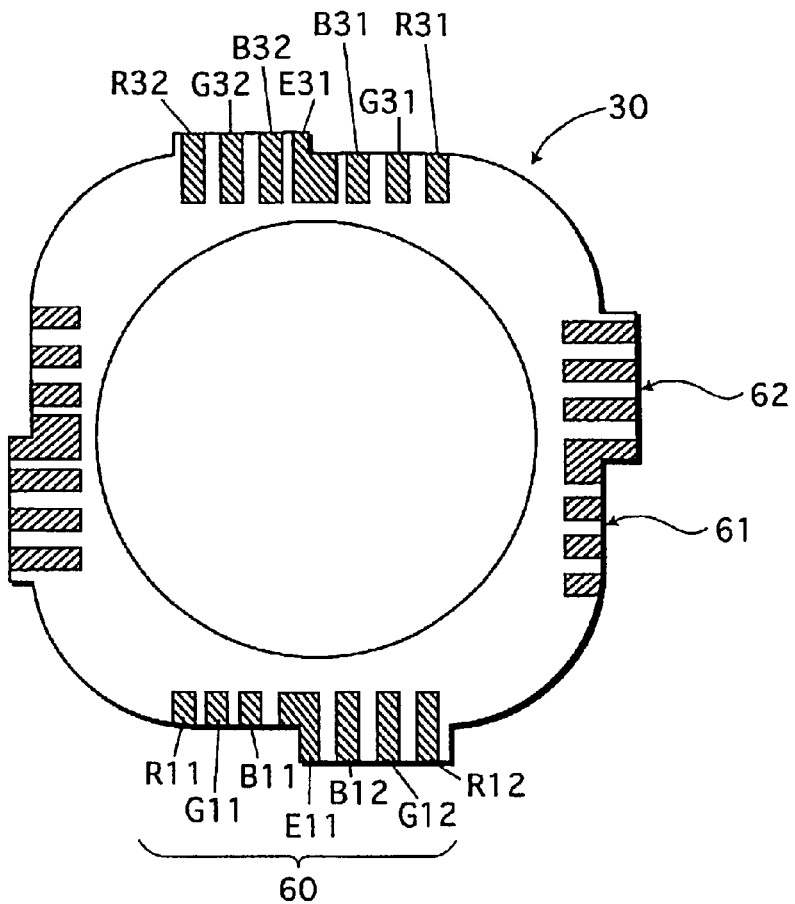
FIG. 6A shows example feeder terminals.

(1) In FIG. 5, the four pairs of projection and depression are formed, and the feeder terminals are provided at these projections and depressions in a predetermined order. As an alternative, one pair of projection and depression may be formed, with the feeder terminals being arranged at the projection and the depression in a predetermined order, as shown in FIG. 6A.

As illustrated, a wide depression 61 and a wide projection 62 are formed in each part of the periphery of the flexible substrate 30 where a terminal set is provided. A terminal set 60 has seven feeder terminals R11, G11, B11, E11, B12, G12, and R12 which are arranged in this order on the periphery of the flexible substrate 30 counterclockwise.

In more detail, the common feeder terminal E11 is formed across the difference in level caused by the depression 61 and the projection 62. The pair of red feeder terminals R11 and R12, the pair of green feeder terminals G11 and G12, and the pair of blue feeder terminals B11 and B12 are each arranged at the depression 61 and the projection 62, in symmetry with respect to the common feeder terminal E11.

Figure 6B:
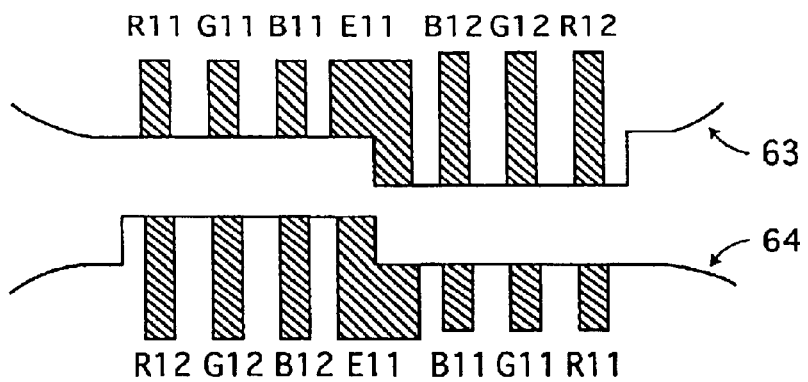
FIG. 6B is an expanded view of the feeder terminals shown in FIG. 6A.
Figure 6C:
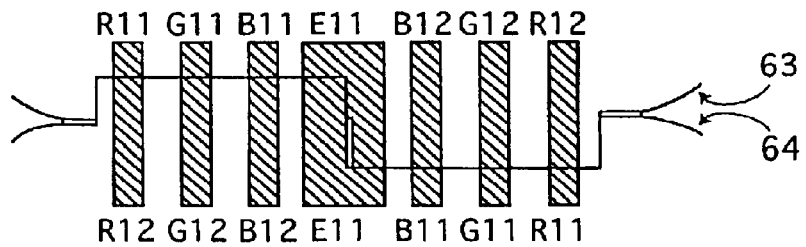
FIG. 6C shows the state where the feeder terminals shown in FIG. 6B are combined.

FIG. 6B shows light-emitting substrates 63 and 64 having this construction. These light-emitting substrates 63 and 64 can be connected as follows. When a projection of the light-emitting substrate 63 and a depression of the light-emitting substrate 64 are fitted together, the same-type feeder terminals R11 and R12, G11 and G12, B11 and B12, and E11 and E11 overlap one another as shown in FIG. 6C, in the same way as FIG. 5B. These feeder terminals are connected using soldering or the like.

With this construction, light-emitting substrates can be connected more easily and quickly, since it is easier to fit together one pair of projection and depression than to fit together four pairs of projection and depression as in the case of FIG. 5.

Figure 7A:
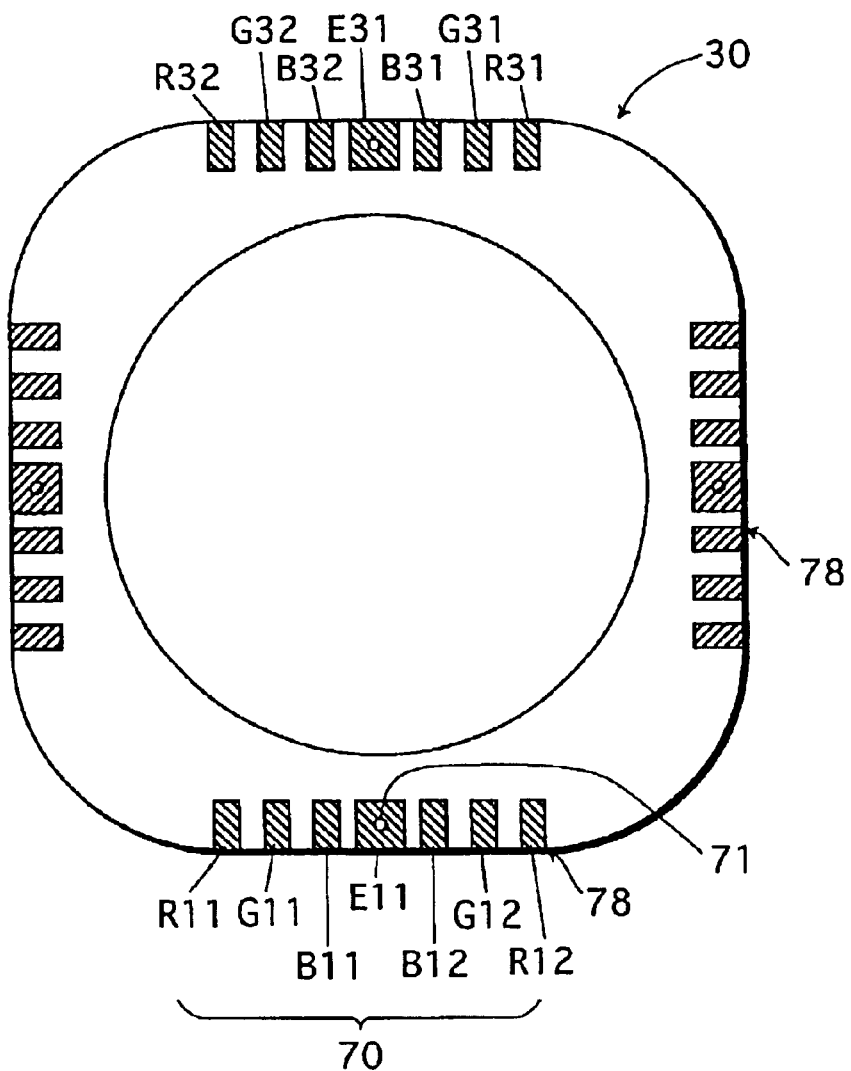
FIG. 7A shows example feeder terminals.

(2) In the modification (1), the light-emitting units are connected by forming a projection and a depression on the periphery of the flexible substrate 30 and fitting together a projection of one light-emitting unit and a depression of the other light-emitting unit. However, a projection and a depression may not be formed in each area of the periphery of the flexible substrate 30 where a terminal set is provided, as shown in FIG. 7A. Light-emitting units having this construction can be connected using a joint plate 72 shown in FIG. 7B.

Figure 8A:
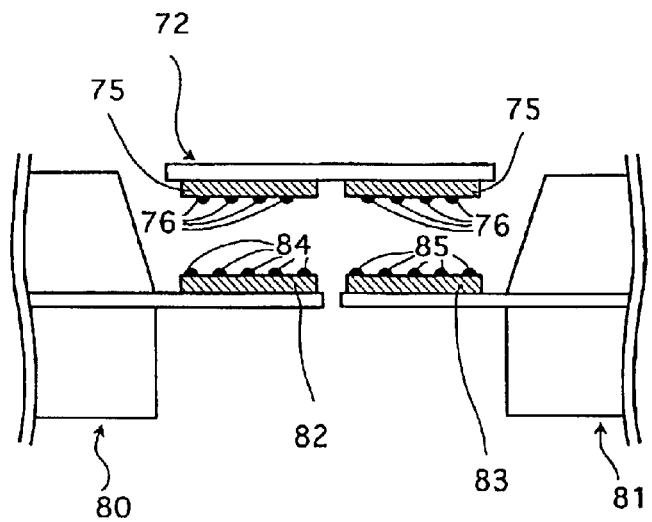
FIGS. 8A–8C show a method of connecting the feeder terminals shown in FIG. 7A using the joint plate shown in FIG. 7B.

As shown in FIG. 7A, a straight part 78 is formed in each area of the periphery of the flexible substrate 30 where a terminal set is provided. A terminal set 70 has seven feeder terminals R11, G11, B11, E11, B12, G12, and R12 which are arranged in this order in the straight part 78 counterclockwise. Also, bumps 84 or bumps 85 are formed on each feeder terminal, as shown in FIG. 8A. Furthermore, a depression 71 is formed at the center of the common terminal E11, as shown in FIG. 7A.

Figure 7B:
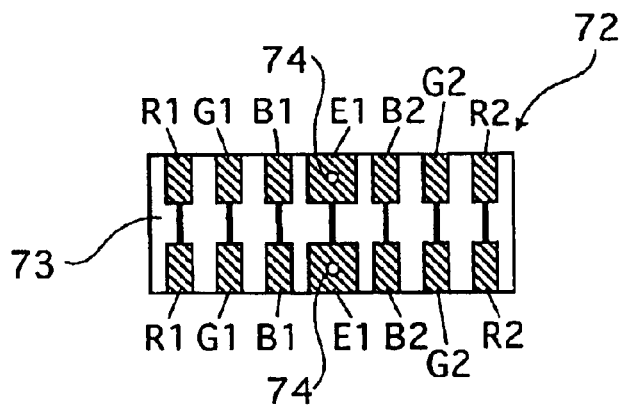
FIG. 7B shows a joint plate for connecting the feeder terminals shown in FIG. 7A.

FIG. 7B shows the joint plate 72. The joint plate 72 has a rectangular flexible plate 73. Seven feeder terminals R1, G1, B1, E1, B2, G2, and R2 are formed along each of the two longitudinal sides of the flexible plate 73, corresponding to the feeder terminals R11, G11, B11, E11, B12, G12, and R12 of the terminal set 70. The same-type feeder terminals R1 and R1, G1 and G1, B1 and B1, . . . are connected by wiring. Also, bumps 76 are formed on each of the feeder terminals R1, G1, B1, E1, B2, G2, and R2, as shown in FIG. 8A. Furthermore, a projection 74 is formed at the center of the feeder terminal E1, as shown in FIG. 7B. When the projections 74 of the feeder terminals E1 are fitted into the depressions 71 of the feeder terminals E11 of two terminal sets 70, the same-type feeder terminals between the joint plate 72 and the terminal sets 70, namely, R1 and R11, G1 and G11, B1 and B11, . . . , meet each other.

FIG. 8 shows how to connect two terminal sets 70 using the joint plate 72.

Figure 8B:
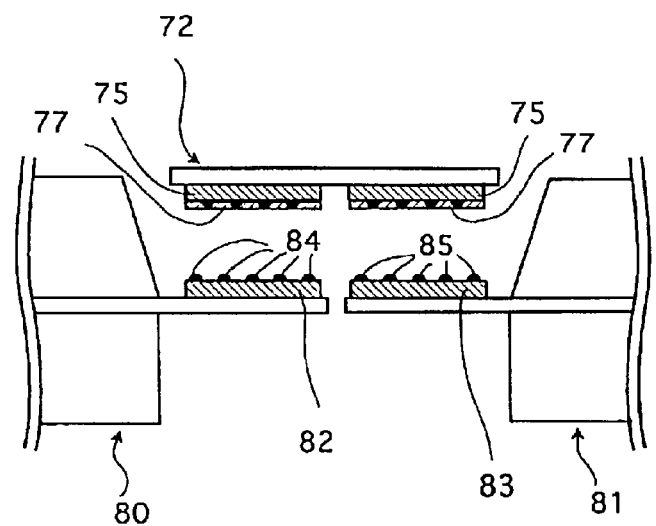
Figure 8C:
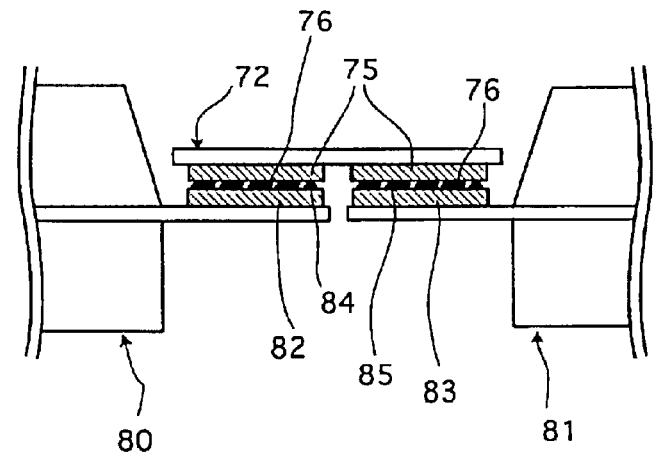

In FIG. 8A, two light-emitting units 80 and 81 and the joint plate 72 are aligned. In FIG. 8B, the surfaces of feeder terminals 75 of the joint plate 72 are coated with an epoxy thermosetting adhesive 77 (e.g. OMBOND manufactured by OMRON Corporation). The feeder terminals 75 are then placed onto feeder terminals 82 and 83 of the light-emitting units 80 and 81. As a result, the bumps 76 and the bumps 84 and 85 are crushed against each other and joined together. Hence the feeder terminals 82 and 83 are connected to each other via the joint plate 72, as shown in FIG. 8C.

By using a joint plate in this way, the labor of connecting feeder terminals is reduced when compared with the case where soldering or the like is used.

Figure 9A:
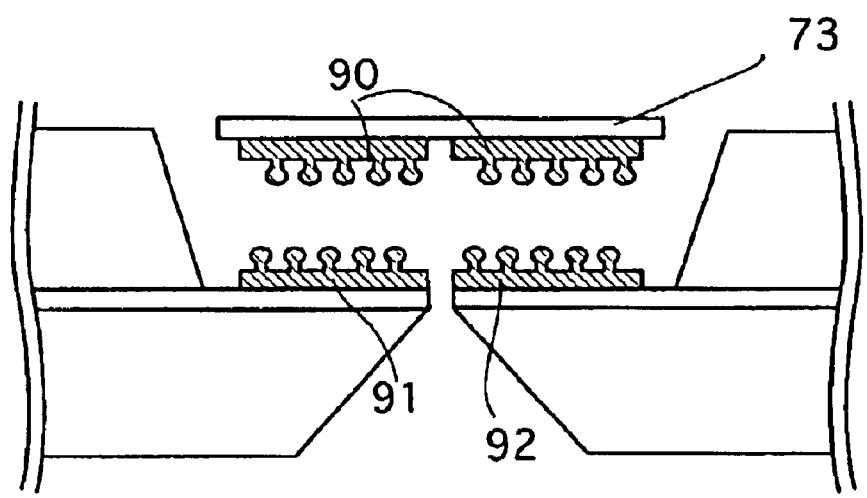
FIGS. 9A and 9B show an example of using flat fasteners for feeder terminals.
Figure 9B:
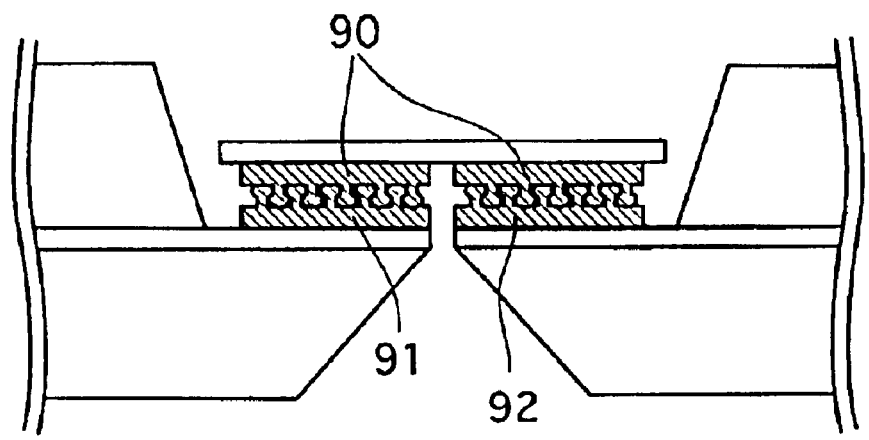

(3) In the modification (2), the bumps are formed on the feeder terminals, and the feeder terminals are connected to each other via the joint plate using the adhesive. As an alternative, feeder terminals 90, 91, and 92 of terminal sets and a joint plate 73 may be formed using sheet fasteners called Multilock (Multilock is a trademark of Kuraray Co., Ltd), as shown in FIG. 9A. Such feeder terminals can be connected by fitting them together, as shown in FIG. 9B.

Here, the feeder terminals 90, 91, and 92 have mushroom-shaped components which are formed from a resin such as a polyimide, and have their surfaces plated with a high conductive metal (e.g. gold or copper).

In this way, feeder terminals can be connected just by fitting them together, with there being no need to use an adhesive. This enables the feeder terminals to be attached and removed freely.

Figure 10A:
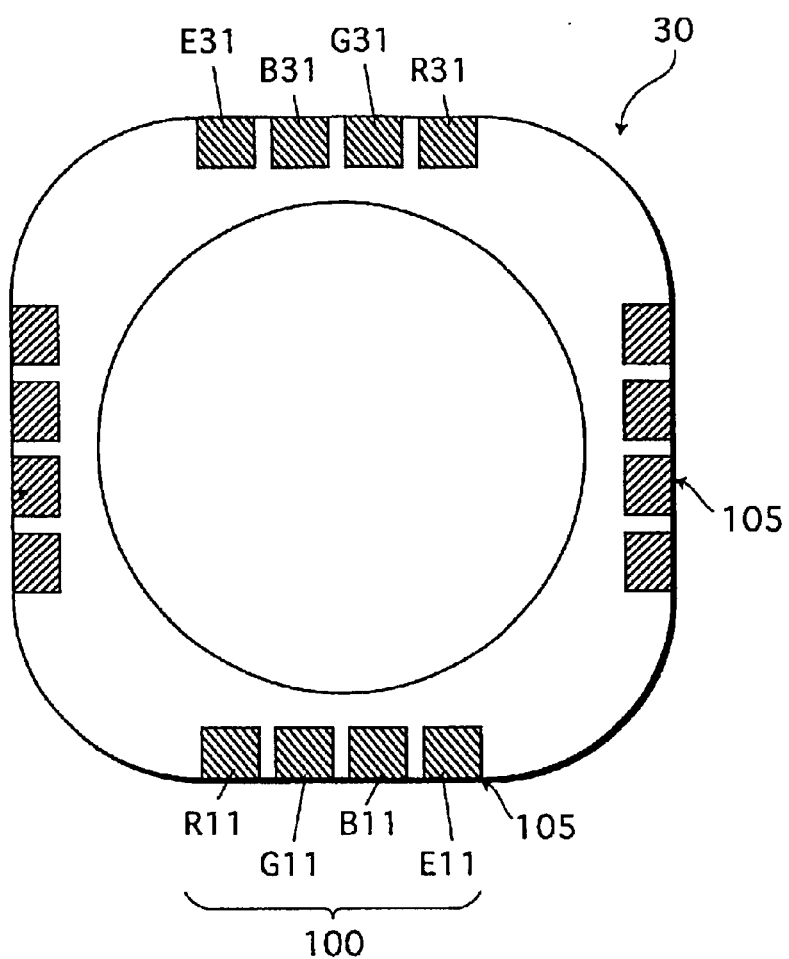
FIG. 10A shows example feeder terminals.

(4) In the above embodiment, one pair of red feeder terminals, one pair of green feeder terminals, one pair of blue feeder terminals, and one pair of common feeder terminals are provided for each terminal set. However, the number of feeder terminals may be reduced by half, as shown in FIG. 10A. Light-emitting units having this construction can be connected using a joint plate 103 shown in FIG. 10C.

As shown in FIG. 10A, a straight part 105 is formed in each area of the periphery of the flexible substrate 30 where a terminal set is provided. A terminal set 100 has four different feeder terminals R11, G11, B11, and E11 which are arranged in this order in the straight part 105 counterclockwise.

Figure 10B:
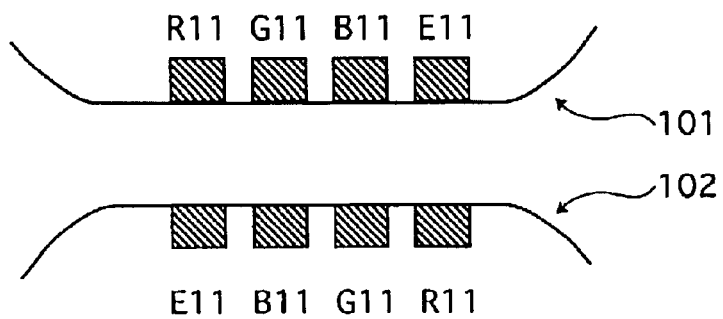
FIG. 10B shows the feeder terminals shown in FIG. 10A.

Suppose light-emitting substrates 101 and 102 having this construction are connected in the same way as above. In this case, feeder terminals of different types will end up meeting each other. Which is to say, the feeder terminal R11 meets the feeder terminal E11, and the feeder terminal G11 meets the feeder terminal B11, as shown in FIG. 10B.

Figure 10C:
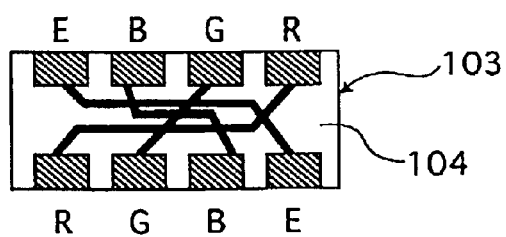
FIG. 10C shows a joint plate for connecting the feeder terminals shown in FIG. 10B.

FIG. 10C shows the joint plate 103. The joint plate 103 has a rectangular flexible plate 104. Four feeder terminals E, B, G, and R are formed in this order along one longitudinal side of the flexible plate 104 and in the reverse order along the other longitudinal side of the flexible plate 104. The same-type feeder terminals E and E, B and B, . . . are connected through vias (not illustrated) and the like.

With the provision of such a joint plate 103, the same-type feeder terminals E11 and E11, B11 and B11, . . . of the light-emitting substrates 101 and 102 can be connected to each other.

Thus, two light-emitting units can be connected together even when each terminal set is composed of four feeder terminals. When the number of feeder terminals in one light-emitting unit is reduced in this way, the number of wires for connecting the feeder terminals with the wiring patterns QR, QG, QB, and CE can be reduced too.

(5) In the modification (4), the feeder terminals are provided on one surface of the flexible substrate 30. As an alternative, the feeder terminals may be provided on both surfaces of the flexible substrate 30, as shown in FIGS. 11A–11D.

As can be seen from FIG. 11A, predetermined parts of the flexible substrate 30 are slightly projected outward, with a terminal set being provided at each of these projections 111.

A terminal set 112 has four different feeder terminals which are provided on both surfaces of the flexible substrate 30 at a projection 111. Here, an arrangement order of the feeder terminals provided on the front surface is the reverse of an arrangement order of the feeder terminals provided on the back surface. Which is to say, the four feeder terminals R11, G11, B11, and E11 are arranged in this order on the front surface, whereas the four feeder terminals E12, B12, G12, and R12 are arranged in this order on the back surface (when looked at from the front surface side). The same-type feeder terminals R11 and R12, G11 and G12, . . . are interlayer-connected through vias (not illustrated) and the like.

Light-emitting substrates 110 and 113 having this construction can be connected as follows. As shown in FIG. 11C, the feeder terminals on the front surface of the light-emitting substrate 110 are in the reverse order of the feeder terminals on the front surface of the light-emitting substrate 113. In other words, the feeder terminals on the front surface of the light-emitting substrate 110 are in the same order as the feeder terminals on the back surface of the light-emitting substrate 113 (i.e. in the order of red, green, blue, and common). This being the case, the feeder terminals R11, G11, B11, and E11 on the front surface of the light-emitting substrate 110 are coated with a conductive adhesive or the like, and bonded to the respective feeder terminals R12, G12, B12, and E12 on the back surface of the light-emitting substrate 113. Hence the same-type feeder terminals R11 and R12, G11 and G12, . . . are connected to each other, as shown in FIG. 11D.

Thus, by arranging feeder terminals on both surfaces of the flexible substrate 30 so that an arrangement order on one surface is the reverse of an arrangement order on the other surface, two light-emitting units can be connected without having to use a joint plate or the like.

Second Embodiment

The first embodiment concerns a construction of a light-emitting unit and a method of connecting two light-emitting units. The second embodiment concerns a lighting apparatus of a solid appearance which is produced by assembling a plurality of such light-emitting units.

Figure 12A:
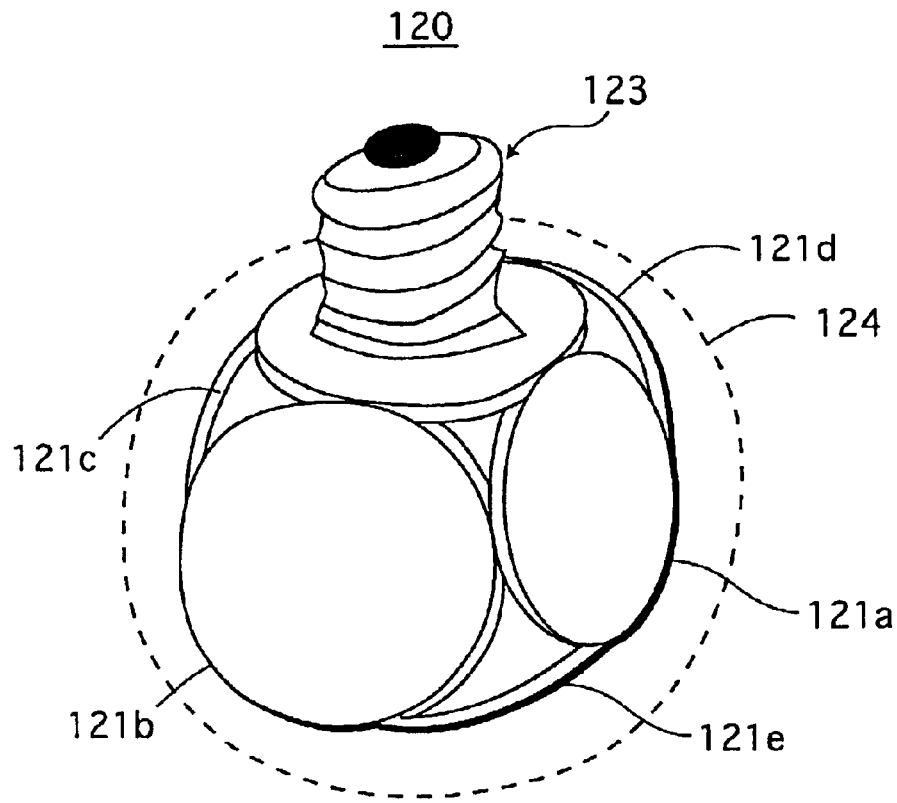
FIG. 12A is a perspective view of a lighting apparatus of a solid appearance which is the second embodiment of the invention, the lighting apparatus being assembled using a plurality of light-emitting units.

FIG. 12A is a perspective view of a lighting apparatus 120 produced by assembling a plurality of light-emitting units which each have four terminal sets.

In the drawing, the lighting apparatus 120 has the following construction. Five light-emitting units 121a–121e which each have four terminal sets (hereafter a light-emitting unit having four terminal sets is also referred to as a "four-connection unit") and a bulb-type base unit 123 which has a drive circuit are connected together to form a solid figure. This solid is covered, for instance, with a transparent spherical cover 124. Here, any of the above described methods can be used to connect the light-emitting units 121a–121e.

Figure 12B:
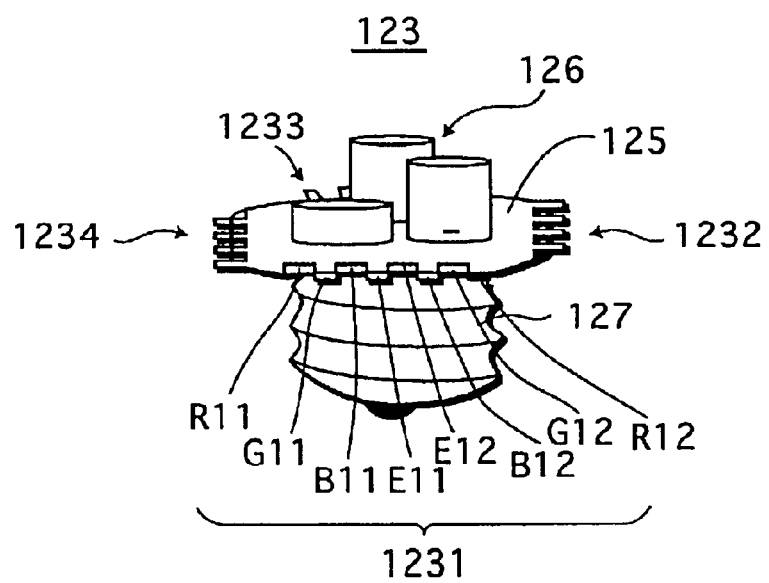
FIG. 12B is a perspective view of a bulb-type base unit in the lighting apparatus shown in FIG. 12A.

The base unit 123 is equipped with a circular flexible substrate 125, a drive circuit 126, and a bulb-type base 127, as shown in FIG. 12B. Note that the circularity of the flexible substrate 125 is compromised in the drawing because terminal sets (described later) are illustrated in close-up.

Terminal sets 1231–1234 are provided at regular intervals on the periphery of the flexible substrate 125. The terminal sets 1231–1234 are each made up of the eight feeder terminals R11, . . . , G11, . . . , B11, . . . , and E11, . . . , like the terminal sets 31–34 of the light-emitting substrate 3 in the first embodiment. Here, the feeder terminals of the same type are connected so as to have the same potential. This construction enables the flexible substrate 125 to be connected with any of the four-connection units 121a–121e, and supply power to all of the four-connection units 121a–121e through any of the terminal sets 1231–1234.

The base 127 is connected to an external power supply. Power is supplied from the external power supply to the drive circuit 126, via the base 127. The base 127 is provided on the back surface of the flexible substrate 125.

The drive circuit 126 includes a power supply circuit 128 for converting AC power to DC power, and a control circuit 129, as shown in FIG. 13. The drive circuit 126 is mounted on the front surface of the flexible substrate 125.

The control circuit 129 includes a pulse width modulation circuit 129a, a microcomputer 129b, and a DIP switchpack 129c.

The pulse width modulation circuit 129a is controlled by the microcomputer 129b to provide a fixed amount of current to the LED chips of each of red, green, and blue LR1, . . . , LG1, . . . , and LB1, . . . , so as to stabilize light emitted from the LED chips of each color. In more detail, the pulse width modulation circuit 129a supplies pulses to the eight feeder terminals R11, R12, G11, G12, B11, B12, E11, and E12 so that the red, green, and blue LED chips illuminate alternately. The pulse width modulation circuit 129a also performs pulse width modulation under control of the microcomputer 129b. This causes the luminance of the red, green, and blue LED chips to vary, thereby producing an extensive variation in color temperature. In this embodiment, the pulse frequency is set at 45 kHz. Therefore, it appears to the human eye that the red, green, and blue LED chips illuminate simultaneously.

The microcomputer 129b stores pulse width conditions corresponding to color temperatures. The DIP switchpack 129c is used to set a condition for color temperature. Here, the DIP switchpack 129c may be replaced by a wired or wireless communication device for realizing external operations. In this way, the color temperature can be set using a remote control.

Figure 14:
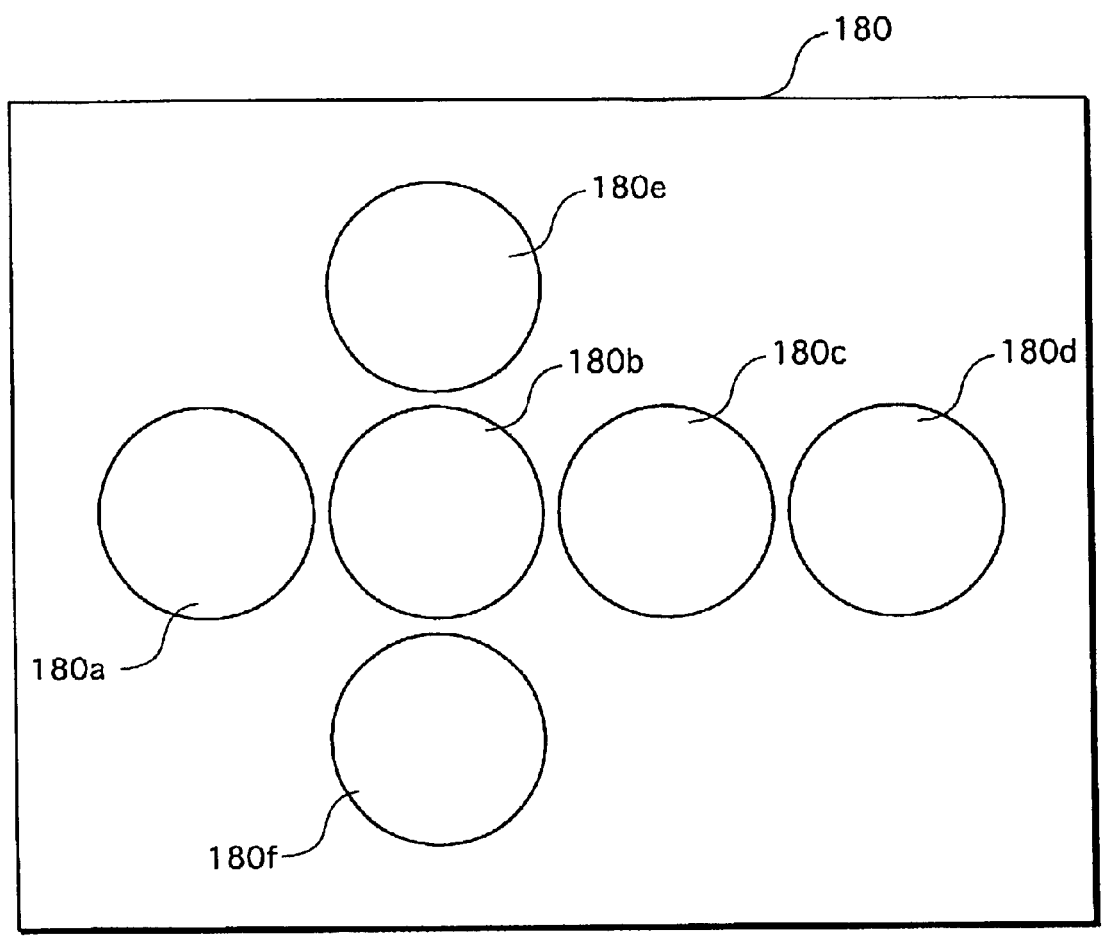
FIG. 14 is a top view of a jig used for assembling light-emitting units into a solid figure.

The following explains a method of assembling the solid lighting apparatus 120, by referring to FIGS. 14 and 15.

FIG. 14 is a top view of a light-emitting unit positioning jig 180 used for assembling the lighting apparatus 120.

The jig 180 is obtained as follows. A solid figure formed by flat circular planes is developed into a plane figure, and depressions 180a, . . . are formed at the base for the corresponding circular planes. Just fitting light-emitting units one by one into these depressions 180a, . . . enables the positioning of the light-emitting units in the plane figure to be determined.

FIG. 15 shows a method of automatically connecting the light-emitting units using the jig 180. The light-emitting units used here are fundamentally the same as that shown in FIG. 7, except that ultrasonic bonding is used instead of an adhesive.

Figure 15A:
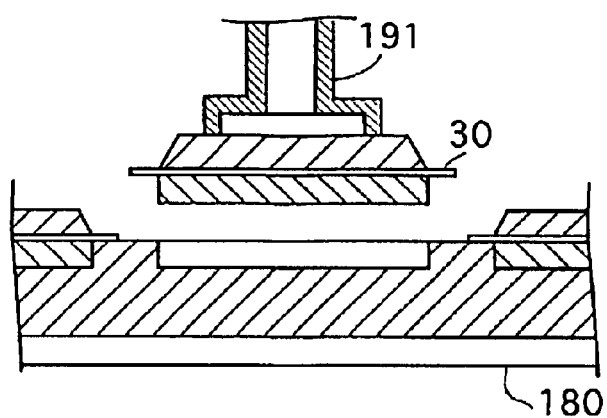
FIGS. 15A–15D show a process of connecting light-emitting units using joint plates.
Figure 15B:
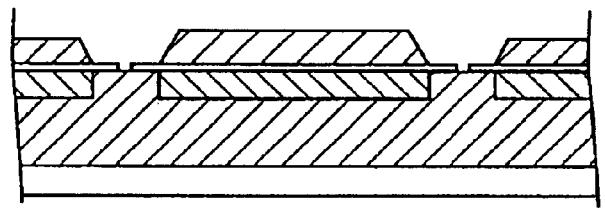

In FIG. 15A, a light-emitting unit is held by vacuum tweezers 191 attached to a robotic arm (not illustrated), and set in a depression of the jig 180.

Figure 15C:
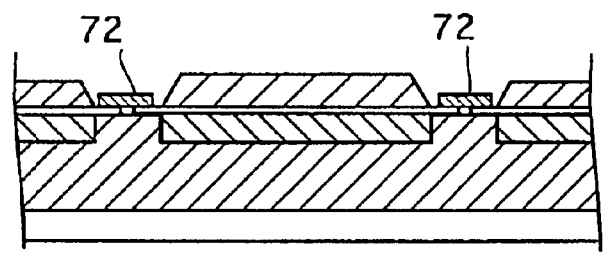

Once light-emitting units have been set in all depressions (FIG. 15B), joint plates 72 are set between the adjacent light-emitting units using the vacuum tweezers (FIG. 15C).

Figure 15D:
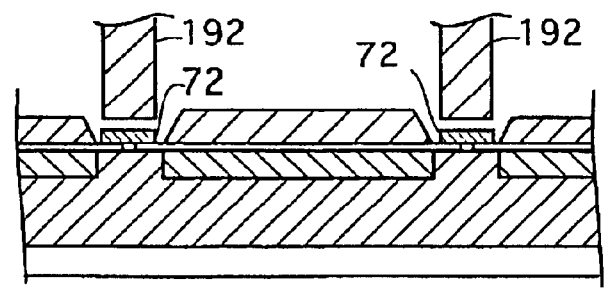

Once the joint plates 72 have been set, the joint plates 72 are pressed against the flexible substrates 30 of the adjacent light-emitting units using the end of an ultrasonic oscillator horn 192, and ultrasonic oscillations are applied to connect the joint plates 72 and the flexible substrates 30, as shown in FIG. 15D.

After all joint plates 72 are connected to the flexible substrates 30, the connected light-emitting units are extracted from the jig 180, and bent at the joint plates 72 to form a desired solid shape.

When forming such a solid, the connection between two light-emitting units at both ends of the solid and the connection between a light-emitting unit and a base unit may be performed by manual soldering or the like through the use of a suitable joint plate.

According to the above assembly method, most operations can be carried out automatically, with it being possible to save manpower.

Thus, a plurality of light-emitting units can be assembled into a wide variety of solid and other figures, by connecting terminal sets of the plurality of light-emitting units flatly and then bending the connecting parts.

Third Embodiment

The third embodiment modifies the lighting apparatus 120 of the second embodiment shown in FIG. 12A, in the following way.

Figure 16:
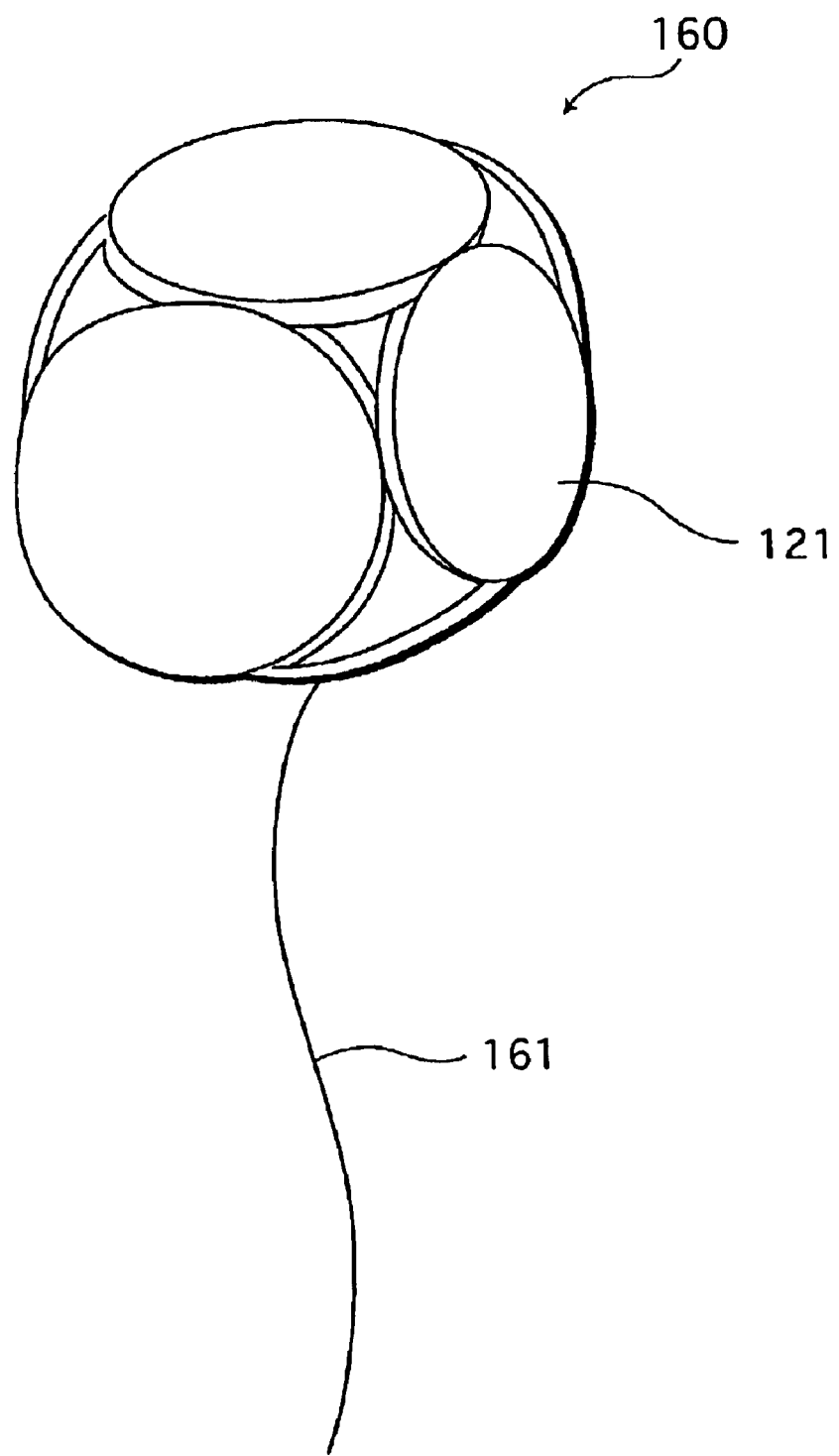
FIG. 16 is a perspective view of a lighting apparatus which is the third embodiment of the invention, the lighting apparatus having a power supply cable as feeding means and being filled with helium or the like so as to float in the air.

FIG. 16 shows a lighting apparatus 160. This lighting apparatus 160 differs from the lighting apparatus 120 in that the spherical cover 124 has been removed, the base unit 123 has been replaced by a light-emitting unit having a lead wire 161, and a balloon has been put inside. Apart from these differences, the lighting apparatus 160 has the same construction as the lighting apparatus 120, so that an explanation on their common parts has been omitted here. Note that the lead wire 161 is a conductor for supplying power to the light-emitting units.

A device (not illustrated) equipped with the aforementioned control circuit 129 is provided between the lead wire 161 and an external power supply. The lead wire 161 is a stranded conductor made up of eight wires corresponding to eight feeder terminals of one terminal set in a light-emitting unit. Each wire is soldered to a different one of these feeder terminals.

The balloon inside the lighting apparatus 160 is a sphere filled with a light gas such as helium, and allows the lighting apparatus 160 to float in the air.

Here, a solar panel may be used instead of the external power supply for supplying power, with it being possible to lift limitations on the usage location of the lighting apparatus 160.

Moreover, the solar panel may be directly connected to the lighting apparatus 160 without using the lead wire 161. For example, a four-connection unit having a solar panel on its front surface and a charger on its back surface may be included in the lighting apparatus 160. If the solar panel is charged during the day, the lighting apparatus 160 can be illuminated at nighttime.

Modifications

Although the light-emitting unit and lighting apparatus of the present invention have been described based on the embodiments, the invention should not be limited to such. It should be obvious that various modifications can be made without departing from the technical scope of the invention. The following are representative examples of such modifications.

(1) The first embodiment describes the case where the light-emitting unit has the shape of a circle, but the light-emitting unit may instead have the shape of an ellipse.

(2) The first embodiment uses LEDs as light-emitting elements, but an EL (electroluminescence) device may instead be used. In this case, the EL device is shaped like a circle, and bonded onto a substrate which has feeder terminals around its periphery. Hence a single EL device can be substituted for a plurality of LEDs.

(3) The first embodiment describes the case where the terminal sets are provided at regular intervals on the periphery of the flexible substrate. However, the terminal sets may not necessarily be provided at regular intervals, so long as they are apart from each other. Also, though the number of terminal sets is four in the first embodiment, the invention can be realized as long as at least three terminal sets are provided on the flexible substrate around its periphery.

(4) The first embodiment describes the case where the joint plate connects terminal sets of two light-emitting units which are provided at straight parts of the same length. However, the joint plate may be shaped like a trapezoid, with it being possible to connect terminal sets of two light-emitting units which are provided at straight parts of different lengths.

(5) The second embodiment describes the case where the solid lighting apparatus is assembled using a plurality of light-emitting units, but this can be modified as follows. A plurality of light-emitting units are arranged flatly and their terminal sets are connected to each other, thereby forming a flat lighting apparatus.

(6) The second embodiment describes the case where the solid lighting apparatus is formed using a plurality of light-emitting units which each have four terminal sets. However, this is not a limit for the invention, which can be realized in other shapes such as a hand drum using combinations of circular or elliptic different-sized light-emitting units which each have at least three terminal sets.

(7) The first embodiment uses the LED chips of the three colors of red, green, and blue, but the colors of LED chips and the number of colors are not limited to such. For example, only the color of white may be used, or multiple colors may be used. If only one color is used, a multilayer substrate can be replaced with a single-layer substrate.

(8) In the first embodiment, the cathode electrodes of the LED chips at the low-potential end of the different-colored LED chip trains are connected to the common feeder terminals (the feeder terminals designated with "E"), and the anode electrodes of the LED chips at the high-potential end of the different-colored LED chip trains are connected to the feeder terminals of the corresponding colors (the feeder terminals designated with "R", "G", and "B"). However, the wiring patterns and the like may be constructed so as to reverse this connection relationship. Which is to say, it is possible to connect the anode electrodes of the LED chips at the high-potential end of the different-colored LED chip trains to the common feeder terminals, and connect the cathode electrodes of the LED chips at the low-potential end of the different-colored LED chip trains to the feeder terminals of the corresponding colors. Even with this construction, the amount of light emission can be varied according to color, by setting different potentials for the different-colored feeder terminals.

Although the present invention has been fully described by way of examples with reference to the accompanying drawings, it is to be noted that various changes and modifications will be apparent to those skilled in the art.

Therefore, unless such changes and modifications depart from the scope of the present invention, they should be construed as being included therein.

What is claimed is:

1. A light-emitting unit comprising:
   a flat member which has a round shape;
   a light-emitting member which is provided on a main surface of the flat member;
   at least three sets of terminals which are provided on a periphery of the flat member so as to be apart from each other;
   a wiring pattern which is provided to the flat member to connect each set of terminals with the light-emitting member; and
   a light scatterer which scatters light emitted from the light-emitting members, wherein the light-emitting member is made up of a plurality of light-emitting diodes that are set at frequent intervals on the main surface of the flat member.

2. The light-emitting unit of claim 1,
   wherein the light-emitting member has a first electrode and a second electrode, and emits light when power is supplied through the first and second electrodes,
   each set of terminals includes a first terminal and a second terminal, and
   the wiring pattern connects the first terminal to the first electrode, and the second terminal to the second electrode.

3. The light-emitting unit of claim 2,
   wherein each set of terminals further includes a third terminal,
   the wiring pattern connects the third terminal to the second electrode, and
   each set of terminals is provided so that the second and third terminals are symmetrically positioned with respect to the first terminal.

4. The light-emitting unit of claim 1,
   wherein the light-emitting member is made up of a plurality of light-emitting elements that emit light of different colors,
   the plurality of light-emitting elements are set at frequent intervals on the main surface of the flat member, with each light-emitting element being connected in series with other light-emitting elements that emit light of the same color as the light-emitting element,
   each set of terminals includes a common terminal and color terminals, the color terminals corresponding to the different colors, and
   the wiring pattern connects an electrode at one of a low-potential end and a high-potential end of each group of series-connected light-emitting elements to the common terminal, and connects an electrode at the other end of each group of series-connected light-emitting elements to a color terminal that corresponds to the same color as the group.

5. The light-emitting unit of claim 1,
   wherein the light-emitting member is made up of a plurality of light-emitting elements that emit light of different colors,
   the plurality of light-emitting elements are set at frequent intervals on the main surface of the flat member, with each light-emitting element being connected in series with other light-emitting elements that emit light of the same color as the light-emitting element,
   each set of terminals includes a common terminal and pairs of color terminals, the pairs of color terminals corresponding to the different colors,
   the wiring pattern connects an electrode at one of a low-potential end and a high-potential end of each group of series-connected light-emitting elements to the common terminal, and connects an electrode at the other end of each group of series-connected light-emitting elements to a pair of color terminals that corresponds to the same color as the group, and
   each set of terminals is provided so that two color terminals that compose each pair of color terminals are symmetrically positioned with respect to the common terminal.

6. The light-emitting unit of claim 5,
wherein a part of the periphery of the flat member where each set of terminals is provided has at least one projection and at least one depression which alternate with each other, and
the common terminal and the pairs of color terminals are arranged at the projections and the depressions.

7. The light-emitting unit of claim 1 further comprising:
a resin layer which has translucency and covers the plurality of light-emitting diodes,
wherein the light scatterer is a metal powder mixed in the resin layer.

8. A light-emitting unit combination comprising:
at least two light-emitting units, each light-emitting unit including:
 a flat member which has a round shape;
 a light-emitting member which is provided on a main surface of the flat member;
at least three sets of terminals which are provided on a periphery of the flat member so as to be apart form each other; and
 a wiring pattern which is provided to the flat member to connect each set of terminals with the light-emitting member,
wherein one set of terminals of a light-emitting unit is set facing one set of terminals of another light emitting unit, and corresponding terminals out of the facing sets of terminals are electrically connected.

9. The light-emitting unit combination comprising:
a joint member which electrically connects the corresponding terminals, wherein in each light-emitting unit:
 (a) the light-emitting member is made up of a plurality of light-emitting elements that emit light of different colors;
 (b) the plurality of light-emitting elements are set at frequent intervals on the main surface of the flat member, with each light-emitting element being connected in series with other light-emitting elements that emit light of the same color as the light-emitting element;
 (c) each set of terminals includes a common terminal and pairs of color terminals, the pairs of color terminals corresponding to the different colors;
 (d) the wiring pattern connects an electrode at one of a low-potential end and a high-potential end of each group of series-connected light-emitting elements to the common terminal, and connects an electrode at the other end of each group of series-connected light-emitting elements to a pair of color terminals that corresponds to the same color as the group; and
 (e) each set of terminals is provided so that two color terminals that compose each pair of color terminals are symmetrically positioned with respect to the common terminal, and
wherein the corresponding terminals which are located at corresponding positions out of the facing sets of terminals are electrically connected using the joint member.

10. The light-emitting unit combination of claim 9,
wherein the joint member includes:
 an insulating substrate which has flexibility; and
 a plurality of contact electrodes which are formed on a main surface of the insulating substrate, and which each contact a different terminal out of the facing sets of terminals.

11. The light-emitting unit combination of claim 8,
wherein in each light-emitting unit:
 (a) the light-emitting member is made up of a plurality of light-emitting elements that emit light of different colors;
 (b) the plurality of light-emitting elements are set at frequent intervals on the main surface of the flat member, with each light-emitting element being connected in series with other light-emitting elements that emit light of the same color as the light-emitting element;
 (c) a part of the periphery of the flat member where each set of terminals is provided has at least one projection and at least one depression which alternate with each other;
 (d) each set of terminals includes a common terminal and pairs of color terminals, the pairs of color terminals corresponding to the different colors;
 (e) the common terminal and the pairs of color terminals are arranged at the projections and the depressions;
 (f) the wiring pattern connects an electrode at one of a low-potential end and a high-potential end of each group of series-connected light-emitting elements to the common terminal, and connects an electrode at the other end of each group of series-connected light-emitting elements to a pair of color terminals that corresponds to the same color as the group; and
 (g) each set of terminals is provided so that two color terminals that compose each pair of color terminals are symmetrically positioned with respect to the common terminal, and
wherein with projections and depressions of the light-emitting units where the facing sets of terminals are present being fitted together, the corresponding terminals which are located at corresponding positions out of the facing sets of terminals are electrically connected.

12. A lighting apparatus comprising:
a plurality of light-emitting units; and
a feeder unit which is connected to an external power supply,
wherein each light-emitting unit includes:
 a flat member which has a round shape;
 a light-emitting member which is provided on a main surface of the flat member;
 at least three sets of terminals which are provided on a periphery of the flat member so as to be apart from each other; and
 a wiring pattern which is provided to the fiat member to connect each set of terminals with the light-emitting member,
the feeder unit includes:
 a flat substrate which has a round shape; and
 at least three sets of feeder terminals which are provided on a periphery of the flat substrate so as to be apart from each other, corresponding feeder terminals out of the at least three sets of feeder terminals being connected in parallel,
the plurality of light-emitting units and the feeder unit are joined at predetermined areas so as to form a polyhedral figure, the predetermined areas each being an area where one set of terminals of a light-emitting unit is put facing one set of terminals of another light-emitting unit or one set of feeder terminals of the feeder unit, with corresponding terminals out of the facing sets of terminals of the light-emitting units being electrically connected to each other, and the plurality of light-emitting units are each electrically connected to the feeder unit in parallel.

13. The lighting apparatus of claim 12, wherein the plurality of light-emitting units are joined by soldering the corresponding terminals.

14. The lighting apparatus of claim 12 further comprising:
a plurality of joint members which have connector electrodes to be connected to terminals of the plurality of light-emitting units,
wherein the plurality of joint members are used to join the plurality of light-emitting units.

15. A lighting apparatus that receives power from an external power supply circuit, comprising:
a plurality of light-emitting units, each light-emitting unit including:
  a flat member which has a round shape;
  a light-emitting member which is provided on a main surface of the flat member;
  at least three sets of terminals which are provided on a periphery of the flat member so as to be apart from each other; and
  a wiring pattern which is provided to the flat member to connect each set of terminals with the light-emitting member,
wherein the plurality of light-emitting units are joined at predetermined areas so as to form a polyhedral figure, the predetermined areas each being an area where one set of terminals of a light-emitting unit is put facing one set of terminals of another light-emitting unit, with corresponding terminals out of the facing sets of terminals being electrically connected to each other, and
the plurality of light-emitting units are each electrically connected to the external power supply circuit in parallel.

16. The lighting apparatus of claim 15, wherein the plurality of light-emitting units are joined by soldering the corresponding terminals.

17. The lighting apparatus of claim 15 further comprising:
a plurality of joint members which have connector electrodes to be connected to terminals of the plurality of light-emitting units,
wherein the plurality of joint members are used to join the plurality of light-emitting units.

18. A light-emitting unit comprising:
a flat member which has a round shape;
a light-emitting member which is provided on a main surface of the flat member;
at least three sets of terminals which are provided on a periphery of the flat member so as to be apart from each other; and
a wiring pattern which is provided to the flat member to connect each set of terminals with the light-emitting member,
wherein the light-emitting member has a first electrode and a second electrode, and emits light when power is supplied through the first and second electrodes,
each set of terminals includes a first terminal, a second terminal, and a third terminal,
the wiring pattern connects the first terminal to the first electrode, the second terminal to the second electrode, and the third terminal to the second electrode, and
each set of terminals is provided so that the second and third terminals are symmetrically positioned with respect to the first terminal.

19. A light-emitting unit comprising:
a flat member which has a round shape;
a light-emitting member which is provided on a main surface of the flat member;
at least three sets of terminals which are provided on a periphery of the flat member so as to be apart from each other; and
a wiring pattern which is provided to the flat member to connect each set of terminals with the light-emitting member,
wherein the light-emitting member is made up of a plurality of light-emitting elements that emit light of different colors,
the plurality of light-emitting elements are set at frequent intervals on the main surface of the flat member, with each light-emitting element being connected in series with other light-emitting elements that emit light of the same color as the light-emitting element,
each set of terminals includes a common terminal and color terminals, the color terminals corresponding to the different colors, and
the wiring pattern connects an electrode at one of a low-potential end and a high-potential end of each group of series-connected light-emitting elements to the common terminal, and connects an electrode at the other end of each group of series-connected light-emitting elements to a color terminal that corresponds to the same color as the group.

20. A light-emitting unit comprising:
a flat member which has a round shape;
a light-emitting member which is provided on a main surface of the flat member;
at least three sets of terminals which are provided on a periphery of the flat member so as to be apart from each other; and
a wiring pattern which is provided to the flat member to connect each set of terminals with the light-emitting member,
wherein the light-emitting member is made up of a plurality of light-emitting elements that emit light of different colors,
the plurality of light-emitting elements are set at frequent intervals on the main surface of the flat member, with each light-emitting element being connected in series with other light-emitting elements that emit light of the same color as the light-emitting element,
each set of terminals includes a common terminal and pairs of color terminals, the pairs of color terminals corresponding to the different colors,
the wiring pattern connects an electrode at one of a low-potential end and a high-potential end of each group of series-connected light-emitting elements to the common terminal, and connects an electrode at the other end of each group of series-connected light-emitting elements to a pair of color terminals that corresponds to the same color as the group, and
each set of terminals is provided so that two color terminals that compose each pair of color terminals are symmetrically positioned with respect to the common terminal.

21. A light-emitting unit that is used in combination with another light-emitting unit of the same type, comprising:
- a flat member which has a round shape;
- a light-emitting member which is provided on a main surface of the flat member;
- at least three sets of terminals which are provided on a periphery of the flat member so as to be apart from each other; and
- a wiring pattern which is provided to the flat member to connect each set of terminals with the light-emitting member and also connect same-polarity terminals in the at least three sets of terminals with each other.

22. The light-emitting unit of claim 21,
- wherein the light-emitting member has a first electrode and a second electrode, and emits light when power is supplied through the first and second electrodes,
- each set of terminals includes a first terminal and a second terminal, and
- the wiring pattern connects the first terminal to the first electrode, and the second terminal to the second electrode.

23. The light-emitting unit of claim 22,
- wherein each set of terminals further includes a third terminal,
- the writing pattern connects the third terminal to the second electrode, and
- each set of terminals is provided so that the first terminal is positioned between the second and third terminals.

24. The light-emitting unit of claim 23,
- wherein the at least three sets of terminals have a same shape.

* * * * *